United States Patent
Kenny, Jr. et al.

(10) Patent No.: US 7,019,972 B2
(45) Date of Patent: Mar. 28, 2006

(54) APPARATUS FOR CONDITIONING POWER AND MANAGING THERMAL ENERGY IN AN ELECTRONIC DEVICE

(75) Inventors: Thomas William Kenny, Jr., San Carlos, CA (US); Kenneth E. Goodson, Belmont, CA (US); Juan G. Santiago, Fremont, CA (US); George Carl Everett, Jr., Austin, TX (US)

(73) Assignee: Cooligy, Inc., Mountain View, CA (US)

( * ) Notice: Subject to any disclaimer, the term of this patent is extended or adjusted under 35 U.S.C. 154(b) by 129 days.

(21) Appl. No.: 10/883,530

(22) Filed: Jun. 30, 2004

(65) Prior Publication Data

US 2005/0094374 A1 May 5, 2005

Related U.S. Application Data

(62) Division of application No. 10/384,000, filed on Mar. 7, 2003, which is a continuation of application No. 10/072,137, filed on Feb. 7, 2002, now Pat. No. 6,606,251.

(51) Int. Cl.
*H05K 7/20* (2006.01)

(52) U.S. Cl. .................. 361/699; 361/704; 361/707; 257/714; 174/15.1; 165/80.4

(58) Field of Classification Search .............. 361/699, 361/704, 719; 257/712, 714; 174/15.1; 165/80.4, 165/104.26
See application file for complete search history.

(56) References Cited

U.S. PATENT DOCUMENTS

| | | | | | |
|---|---|---|---|---|---|
| 5,241,450 | A | * | 8/1993 | Bernhardt et al. | .......... 361/689 |
| 5,343,360 | A | * | 8/1994 | Sanwo | .......... 361/707 |
| 5,763,951 | A | * | 6/1998 | Hamilton et al. | .......... 257/714 |
| 5,870,823 | A | * | 2/1999 | Bezama et al. | .......... 29/848 |
| 6,303,992 | B1 | * | 10/2001 | Van Pham et al. | .......... 257/734 |
| 6,570,248 | B1 | * | 5/2003 | Ahn et al. | .......... 257/724 |
| 6,670,699 | B1 | * | 12/2003 | Mikubo et al. | .......... 257/678 |
| 6,796,370 | B1 | * | 9/2004 | Doll | .......... 165/80.4 |

FOREIGN PATENT DOCUMENTS

JP 1-256775 10/1989

\* cited by examiner

*Primary Examiner*—Boris Chervinsky
(74) *Attorney, Agent, or Firm*—Haverstock & Owens LLP

(57) ABSTRACT

In one aspect, the present invention is a technique of, and a system for conditioning power for a consuming device. In this regard, a power conditioning module, affixed to an integrated circuit device, conditions power to be applied to the integrated circuit device. The power conditioning module includes a semiconductor substrate having a first interface and a second interface wherein the first interface opposes the second interface. The power conditioning module further includes a plurality of interface vias, to provide electrical connection between the first interface and the second interface, and a first set of pads, disposed on the first interface and a second set of pads disposed on the second interface. Each of the pads is connected to a corresponding one of the interface vias on either the first or second interface. The power conditioning module also includes electrical circuitry, disposed within semiconductor substrate, to condition the power to be applied to the integrated circuit device. The electrical circuitry may be disposed on the first interface, the second interface, or both interfaces. Moreover, the electrical circuitry includes at least one voltage regulator and at least one capacitor.

9 Claims, 17 Drawing Sheets

APPARATUS FOR CONDITIONING POWER AND MANAGING THERMAL ENERGY IN AN ELECTRONIC DEVICE

This is a divisional of U.S. patent application Ser. No. 10/384,000, filed March 7, 2003, and entitled "APPARATUS FOR CONDITIONING POWER AND MANAGING THERMAL ENERGY IN AN ELECTRONIC DEVICE", the contents of which are hereby incorporated by reference. The U.S. patent application Ser. No. 10/384,000 is a continuation of U.S. Ser. No. 10/072,137 filed Feb. 7, 2002 now U.S. Pat. No. 6,606,251, issued on August 12, 2003, and entitled "POWER CONDITIONING MODULE", the contents of which are hereby incorporated by reference.

BACKGROUND OF THE INVENTION

This invention relates to a method and an apparatus for electrical power conditioning and thermal capture/rejection management systems; and more particularly, in one aspect, to integrating electrical power conditioning techniques and heat capture and removal techniques into or onto a common substrate, such as silicon, germanium, gallium arsenic.

Electronic and electrical devices continue to demand additional power as the number of transistors on a semiconductor device, for example a microprocessor, increase dramatically. As a result of that increasing demand, there is an increasing demand on the power conditioning and heat rejection capabilities of systems that support such devices. For example, as microprocessor speed and transistor count increase, there is an increasing requirement for electrical power (an increase in average power consumption) conditioning. Further, as more and more functions are integrated into the microprocessor, for example, the functions typically performed by the floating point processors and video or graphics processors, the power conditioning system must address or respond to the rapidly varying temporal and spatial levels of power consumption. Moreover, the increase in microprocessor speed and transistor count, and the incorporation of more and more functions into the microprocessor, have also created a rapidly increasing requirement to capture and remove heat generated by such microprocessors.

Power supplies are available to meet the power demands, however, the power supply is often located some distance from the consuming device. The finite wire lengths between the supply and the device include capacitance and inductance that introduce time delays in the delivery of power in response to changes in demand by the consuming device. As mentioned above, the temporal change in power consumption of, for example, a microprocessor, is increasing as processor speeds increase and as more and more functions are incorporated into the microprocessor. In response, power conditioning electrical/electronics systems are being placed closer and closer to the consuming device. Locating the power conditioning elements, such as voltage regulators, capacitors, DC—DC converters, near the consuming device may address the concerns regarding the power conditioning needs.

A conventional configuration of the power conditioning system is illustrated in FIG. 1. That system often includes discrete capacitors, voltage regulators, and AC-DC for DC-BC converters. Briefly, discrete capacitors typically are located in physical proximity with and electrically connected to the integrated circuit device. As such, sudden demands by the device during operation may be satisfied by the charge stored on the capacitor, thereby maintaining a relatively constant input voltage for the time necessary for the increased demand to be addressed by the supply. Such capacitors are typically known as bypass capacitors, and are common elements in analog circuit design, digital circuit design, and power device circuit design.

Voltage regulators are employed to take input power at a high voltage (for example, 7 volts), and provide relatively stable output power at a lower voltage (for example, 1 to 5 volts). Voltage regulators tend to provide the lower voltage with greatly increased immunity to variations in the high voltage level, or to variations in current drawn by the consuming device. Regulators are commonly employed in designs of analog and digital electronic power conditioning systems, and are increasingly likely to be placed in proximity to devices that have rapidly time-varying power requirements.

AC-DC and DC—DC converters are employed to transform a particular supply voltage from a convenient source into an appropriate form for consumption by, for example, the integrated circuit device. In many cases, system power electronics provide for a single, relatively high voltage (for example, 48 volt DC, or 110 volt AC), whereas the integrated circuit device may require very different supply voltages (for example, 1 to 5 volts, DC). Under this circumstance, converters transform the power and provide the input voltage required by the device. In some systems, converters are located as close to the consuming device as possible so as to provide stable voltage during variations in power consumption by that device. (See, for example, U.S. Pat. Nos. 5,901,040; 6,191,945; and 6,285,550).

In addition to the power management considerations, the increase in power consumption of these devices has imposed an additional burden on the thermal management system (i.e., systems that capture, remove and/or reject energy in the form of heat). In response, thermal management systems have employed such conventional techniques as heat sinks, fans, cold plates systems that employ cooling water, and/or combinations thereof for heat-capture, removal and rejection from, for example, an integrated circuit device. Such conventional heat management designs locate the thermal capture and rejection elements on or very near the integrated circuit device packaging.

(See, for example, U.S. Pat. Nos. 6,191,945 and 6,285,550).

For example, with reference to FIG. 1, heat sinks generally consist of metal plates with fins that transport heat from the consuming device to the surrounding air by natural convection. Heat sinks tend to be located or positioned directly on the integrated circuit device packaging. Heat sinks serve to increase the area of contact between the device and the surrounding air, thereby reducing the temperature rise for a given power.

One technique to enhance the heat transfer between a heat sink and the surrounding air is to employ a fan (typically rotating blades driven by electric motors) in conjunction with a heat sink. Fans may enhance the heat transfer between a heat sink and the surrounding air by causing the air to circulate through the heat sink with greater velocity than by natural convection.

Another technique used by conventional systems to enhance the capabilities of the thermal management system is to reduce the thermal resistance between the consuming device and the heat sink. This often involves reducing the number and thickness of the layers between the device, the device package and the heat sink. (See, for example, U.S. Pat. Nos. 6,191,945 and 6,285,550).

In sum, conventional systems address power conditioning and thermal management requirements by placing both the power conditioning and heat capture and rejection elements as close to the integrated circuit device as possible. This has led to the typical, conventional layout that is illustrated in FIG. 1. With reference to FIG. 1, the consuming device is an integrated circuit device. The thermal management element is heat sink that is in contact with the consuming device. In some implementation, the heat capture, removal and rejection (via the heat sink) may be relatively high.

Further, the power conditioning circuitry (capacitors, voltage regulators, AC-DC and DC—DC converters) is positioned next to the consuming device to reduce the wiring length between the supply and the integrated circuit device.

While such conventional power conditioning and thermal management techniques may be suitable for power consumption and heat capture/rejection requirements for some current device, conventional techniques are unlikely to address the anticipated increases in both power consumption and heat capture, removal and rejection requirements of other current devices as well as future devices. Accordingly, there is a need for new power conditioning techniques to accommodate anticipated increases in both power consumption and heat capture, removal and/or rejection requirements.

Moreover, there is a need for improved power conditioning and thermal management techniques to accommodate increases in both power consumption and heat capture, removal and rejection requirements of current and future device. Further, there is a need for improved power conditioning and thermal management techniques for devices that may be implemented in space-constrained applications (for example, portable computers). In this regard, there is a need for incorporating the power conditioning and heat capture/rejection elements into the same volume in a stacked configuration as well as address the anticipated increases in both power consumption and heat capture, removal and rejection requirements.

In addition, there is a need for an improved technique(s) of power conditioning and heat capture/rejection that integrate the power conditioning and heat capture/rejection elements with the consuming device (for example, an integrated circuit device) itself—thereby reducing the deficiencies in the power conditioning due to delays in signal propagation, reducing the thermal resistance from the device to the heat sink due to physical separation and additional interfaces. This results in increasing the overall efficiency of both power conditioning and thermal management capabilities of the system.

Moreover, there is a need for power conditioning and heat capture/rejection elements that are stacked in a compact configuration to facilitate a compact packaged device which limits deficiencies in the power conditioning due to delays in signal propagation, and enhances the thermal attributes of the packaged device.

Further, while such conventional power conditioning techniques may be suitable for some applications, there is a need for a power conditioning technique that addresses the anticipated increases in power consumption in all applications. For example, there is a need for improved power conditioning technique for devices that may be implemented in space-constrained applications. Accordingly, there is a need for improved power conditioning techniques to accommodate anticipated increases in power consumption as well as applications having stringent space requirements.

SUMMARY OF THE INVENTION

In a first principal aspect, the present invention is a power conditioning module, affixed to an integrated circuit device, for conditioning power to be applied to the integrated circuit device. The power conditioning module includes a semiconductor substrate having a first interface and a second interface wherein the first interface opposes the second interface. The power conditioning module further includes a plurality of interface vias, to provide electrical connection between the first interface and the second interface, and a first set of pads disposed on the first interface, each of these pads is connected to a corresponding one of the interface vias on the first interface. The power conditioning module also includes a second set of pads disposed on the second interface, each of these pads is connected to a corresponding one of the interface vias on the second interface.

In addition, the power conditioning module includes electrical circuitry, disposed within a semiconductor substrate, to condition the power to be applied to the integrated circuit device. The electrical circuitry may be disposed on the first interface, the second interface, or both interfaces. Moreover, the electrical circuitry includes at least one voltage regulator and at least one capacitor.

In one embodiment of this aspect of the invention, the power conditioning module also includes at least one power pad disposed on the second interface and at least one power via disposed in the semiconductor substrate. The power via is electrically connected to the power pad to provide electrical connection between the second interface and at least one of the voltage regulator and capacitor. The power via may be electrically connected to a power conduit disposed in the semiconductor substrate. The combination of the power pad, via and conduit provides electrical connection between the second interface and at least one of the voltage regulator and capacitor.

In another embodiment, the power conditioning module may include at least one output power conduit, coupled to the electrical circuitry, to provide conditioned power to the integrated circuit device. The output power conduit may connect to an input power pad disposed on the first interface. The input power pad may correspond to an input of the integrated circuit device.

The power conditioning module of this aspect of the invention may also include current sensor(s), disposed in the semiconductor substrate, to provide information that is representative of a current consumption of the integrated circuit and/or electrical circuit. A controller, coupled to the current sensor, may receive that information and, in response, may adjust the cooling of the integrated circuit and/or the power conditioning module.

The power conditioning module may also include temperature sensor(s), disposed in the semiconductor substrate, to provide information that is representative of a temperature of a region in proximity to the temperature sensor. A controller may be coupled to the temperature sensor to receive that information and, in response, may adjust the cooling of the integrated circuit and/or the power conditioning module.

In a second principal aspect, the present invention is a power conditioning and thermal management module adapted to couple to an integrated circuit device. The power conditioning and thermal management module includes a power conditioning element having a first interface and a second interface, wherein the first interface opposes the second interface. The power conditioning element includes a semiconductor substrate, a plurality of interface vias, disposed in the semiconductor substrate, and electrical circuitry to condition the power to be applied to the integrated circuit device. The electrical circuitry includes at least one voltage regulator and at least one capacitor. The electrical circuitry may be disposed on the first interface, second interface or both interfaces of the power conditioning element.

The power conditioning and thermal management module of this aspect of the invention further includes a thermal management element having a first interface and a second interface wherein the first interface opposes the second interface. The thermal management element, during operation, uses a fluid having a liquid phase to capture thermal energy. The thermal management element includes a substrate, wherein the substrate includes at least a portion of a micro channel disposed therein and configured to permit fluid flow therethrough.

The thermal management element also may include a plurality of interface vias to provide electrical connection between the first interface and the second interface of the thermal management element. The plurality of interface vias of the thermal management element may connect to a corresponding one of the plurality of interface vias of the power management element to provide electrical connection between the first interface of the power conditioning element and the second interface of the thermal management element. In this regard, the first interface of the thermal management element may be physically bonded to the second interface of the power conditioning element.

The power conditioning and thermal management module of this aspect of the invention may also include a pump (for example, an electro-osmotic pump), adapted to connect to the micro channel, to produce the flow of the fluid in the micro channel.

In one embodiment of this aspect of the invention, the power conditioning and thermal management module includes current sensor(s), disposed in the semiconductor substrate, to provide information that is representative of a current consumption of the integrated circuit and/or the electrical circuitry. The power conditioning and thermal management module may also include a controller, coupled to the current sensor, to receive the information that is representative of the current consumption of the integrated circuit. In response to that information, the controller may adjust the flow of the fluid in the micro channel. In this regard, the controller may adjust a rate of flow of fluid output by the pump.

In another embodiment, the power conditioning and thermal management module includes temperature sensor(s), disposed in the power conditioning and thermal management module, to provide information which is representative of the temperature of a region of the power conditioning and thermal management module or in a region of the integrated circuit. A controller, coupled to the temperature sensor, may receive the temperature indicative information and, in response thereto, may adjust the flow of the fluid in the micro channel. For example, the controller may adjust a rate of flow of fluid output by the pump.

In yet another embodiment of this aspect of the invention, the power conditioning and thermal management module includes at least one power pad disposed on the second interface of the thermal management element and at least one power via. The power via is electrically connected to the power pad to provide electrical connection between the second interface of the thermal management element and at least one of the voltage regulator and capacitor. The power via may be electrically connected to a power conduit disposed in the semiconductor substrate of the power management element. The power conduit provides electrical connection between the power via and the electrical circuitry (i.e., at least one of the voltage regulator and capacitor).

In another embodiment, the power conditioning and thermal management module includes at least one power via disposed in the substrate of the thermal management element, at least one power pad disposed on the second interface of the thermal management element, and at least one output power conduit, coupled to the electrical circuitry, to provide conditioned power to the integrated circuit device. The power pad of this embodiment is electrically connected to the power via to provide electrical connection between the second interface of the thermal management element and the electrical circuitry. The output power conduit may connect to an input power pad disposed on the first interface of the power conditioning element. The input power pad corresponds to the power input pin/pad of the integrated circuit device.

In a third principal aspect, the present invention is a power conditioning and thermal management module that couples to an integrated circuit device. The power conditioning and thermal management module has a first interface and a second interface wherein the first interface opposes the second interface. The power conditioning and thermal management module includes a semiconductor substrate, a plurality of interface vias to provide electrical connection between the first interface and the second interface, and a first plurality of pads disposed on the first interface, each of the first plurality of pads is connected to a corresponding one of the interface vias on the first interface. The power conditioning and thermal management module also includes a second plurality of pads disposed on the second interface, each of the second plurality of pads is connected to a corresponding one of the interface vias on the second interface.

In addition, the power conditioning and thermal management module includes electrical circuitry and a micro channel structure. The electrical circuitry is disposed in the semiconductor substrate and conditions the power to be applied to the integrated circuit device. The electrical circuitry may be disposed on the first interface, the second interface or both interfaces. The electrical circuitry includes at least one voltage regulator and at least one capacitor. The micro channel structure includes at least one micro channel disposed in the semiconductor substrate to capture thermal energy.

The power conditioning and thermal management module of this aspect of the invention may also include current sensor(s), temperature sensor(s), and a controller. The current sensor(s), temperature sensor(s), and/or controller may be disposed in the power conditioning and thermal management module. The controller, may be coupled to the current sensor(s) and/or temperature sensor(s), to receive the current or temperature indicative information and, in response thereto, may adjust the rate of capture of thermal energy by the micro channel structure. In this regard, the controller may adjust the flow of the fluid in the micro channel and/or a rate of flow of fluid output by the pump.

In one embodiment of this aspect of the invention, the power conditioning and thermal management module includes at least one power pad disposed on the second interface and; at least one power via. The power pad is electrically connected to the power via to provide electrical connection between the second interface and at least one of the voltage regulator and capacitor. The power via may be electrically connected to a power conduit disposed in the semiconductor substrate. The power conduit provides electrical connection between the power pad and at least one of the voltage regulator and capacitor.

In another embodiment, the power conditioning and thermal management module includes at least one output power conduit, coupled to the electrical circuitry, to provide conditioned power to the integrated circuit device. The output power conduit may connect to an input power pad disposed on the first interface of the power conditioning element. The input power pad may correspond to the power input of the integrated circuit device.

BRIEF DESCRIPTION OF THE DRAWINGS

In the course of the detailed description to follow, reference will be made to the attached drawings. These drawings show different aspects of the present invention and, where appropriate, reference numerals illustrating like structures, components and/or elements in different figures are labeled similarly. It is understood that various combinations of the structures, components and/or elements other than those specifically shown are contemplated and within the scope of the present invention.

DETAILED DESCRIPTION

Figure 1:
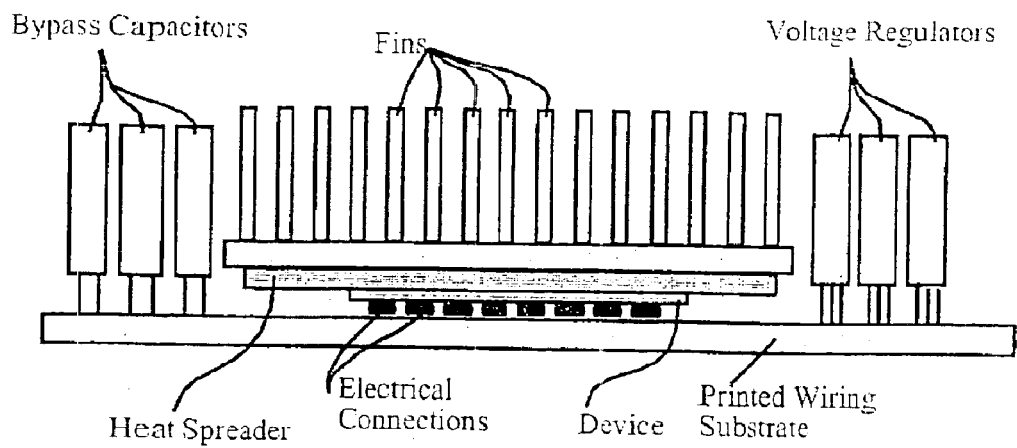
FIG. 1 is a block diagram representation of a conventional approach to power conditioning and heat capture/rejection for integrated circuit, for example, microprocessors.

The present invention is directed to a technique of, and system for conditioning the power applied to a consuming device (for example, an integrated circuit device). The technique and system of the present invention optimize or enhance the power conditioning of the input power for a consuming device by stacking the power conditioning circuitry on or under the consuming device. Several-embodiments of the present invention are well suited for use in space-constrained applications, such as portable or handheld applications, that require a well conditioned input power supply for the consuming device. As such, these embodiments provide an efficient, compact (reduced volume), cost effective power conditioning system.

The present invention is also directed to a technique of, and system for conditioning the power applied to a consuming device as well as managing the heat capture, removal, and/or rejection of a consuming device and the electrical circuitry for conditioning the power. The technique and system of the present invention optimize or enhance the power conditioning and thermal management capabilities according to constraints dictated by, for example, the environment of the application and the needs of the consuming device and system. In this regard, in several of the embodiments, the technique and system of the present invention are also well suited for use in space-constrained applications that also require high heat capture, removal and rejection capabilities. The techniques and systems of these embodiments may combine or integrate the power conditioning circuitry and thermal management element into the same substrate, substrates that have similar footprints, and/or the substrate of the consuming device. As such, the power conditioning and thermal management system of these embodiments provide an efficient, compact, cost effective power conditioning and thermal management techniques.

The present invention also includes embodiments that employ a thermal management element that includes a controller that receives feedback signals from parameter sensors (for example, temperature, pressure and flow) and, responsively modifies the fluid flow from a pump(s), or modifies the fluid flow in the micro channel structure of a heat capture, removal and/or rejection element.

The present invention may also employ a current sensor (s) to provide information representative of the current consumption of the consuming device and/or power conditioning circuitry to a controller. The controller may, in response to that information, anticipate a change in the heat generation of the consuming device and/or power conditioning circuitry and modify the heat capture, removal and/or rejection capabilities of the thermal management element(s). For example, where a pump is employed to provide a working fluid to capture and remove heat, the controller may modify the fluid flow from a pump(s), or modify the fluid flow in the micro channels, to address the anticipated thermal management needs of the consuming device and/or the power conditioning element caused by the change in power consumption.

To further reduce the footprint presented by the power conditioning and thermal management system the thermal management elements may be integrated with the power management module into a common substrate or structure. In this regard, the thermal management element(s) may employ a micro channel structure to capture and remove heat from the consuming device and/or the power conditioning circuitry.

Moreover, the present invention provides a power and thermal management module that may be located or arranged in a manner to efficiently enhance or optimize the power conditioning capabilities depending on the needs or requirements of the system. In addition, location or arrangement of the power and thermal management module of the invention may enhance or optimize the heat capture, removal and/or rejection capabilities of the system. In this regard, the relative location or position of the power conditioning element(s) and thermal management element(s) to each other, and to the consuming device, may enhance or optimize the thermal management as well as power conditioning performance of the system. Under certain circumstances, more than one thermal management element may be implemented in order to further enhance the heat capture and rejection capabilities that may further enhance the reliability of the system (for example, the power management module and the consuming device).

Figure 2:
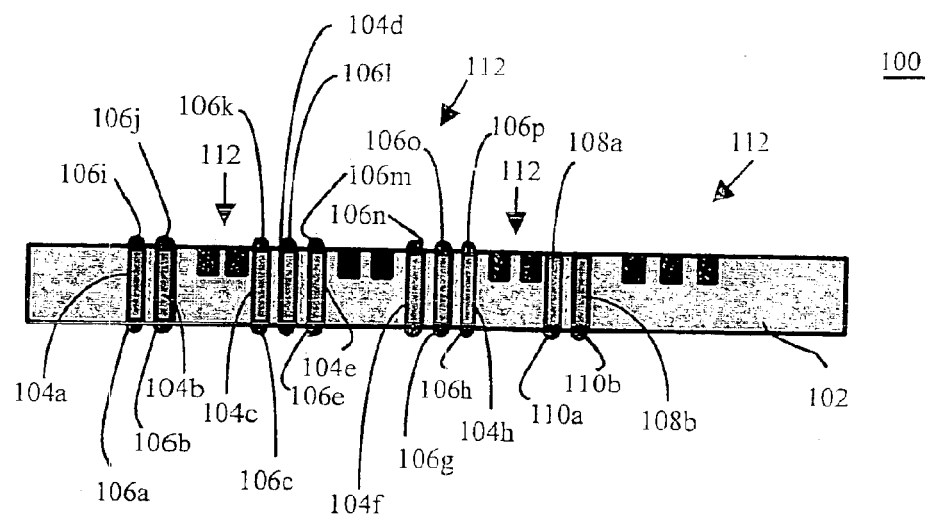
FIG. 2 is a cross-sectional view of a discrete power conditioning module in accordance with one aspect of the present invention.
Figure 3:
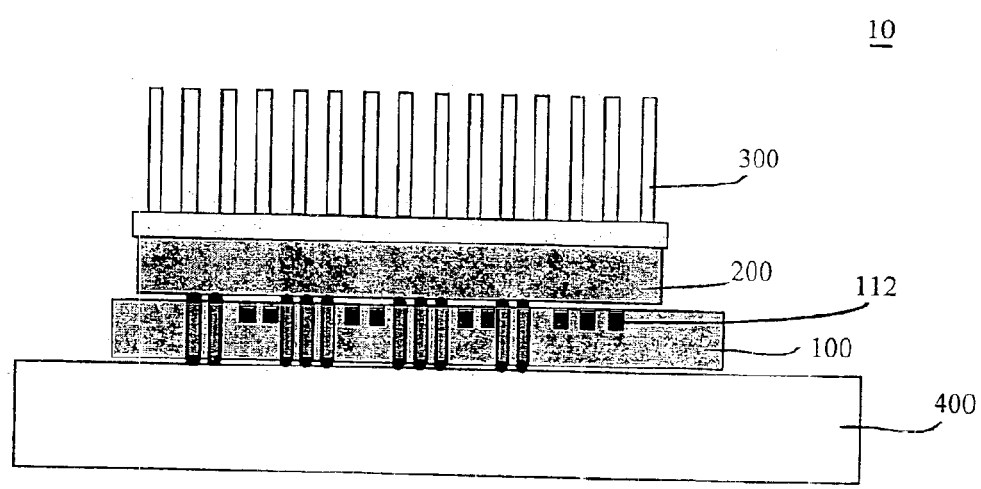
FIG. 3 is a block diagram representation of an embodiment of the power conditioning module of FIG. 2 incorporated in an integrated circuit application.
Figure 4:
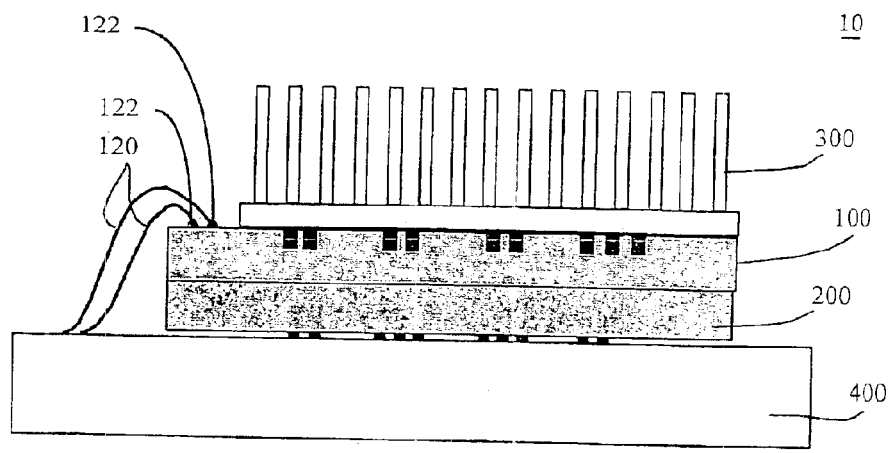
FIG. 4 is a block diagram representation of another embodiment of the power conditioning and heat capture/rejection module according to the present invention incorporated in an integrated circuit application.

With reference to FIGS. 2, 3 and 4, in one embodiment, the present invention is power conditioning module 100 that may be disposed between device 200 (for example, an integrated circuit device such as a microprocessor) and printed circuit board 400, as illustrated in FIG. 3, or between device 200 and thermal management module 300, as illustrated in: FIG. 4. The location of power conditioning module 100, relative to consuming device 200 and thermal management module 300, may be selected according to power, thermal and space considerations of system 10.

The power conditioning module 100 of FIG. 2 includes a semiconductor substrate 102, interface vias 104a–104h, interface pads 106a–106p, power and ground vias 108a and 108b, power and ground pads 110a and 110b, and electrical circuitry 112. The semiconductor substrate 102 includes a first interface for mating or interfacing with device 200 and a second interface for mating or interfacing with a substrate or board 400 (for example, a system printed circuit board such as a mother or daughter board).

The semiconductor substrate 102 may be fabricated from a number of well known materials including, for example, silicon or germanium. In certain circumstances, it may be advantageous to use a material that is the same as, or has similar properties (for example, thermal expansion) to the material used for the substrate of device 200. Such a configuration may provide for enhanced operating reliability since the similar thermal expansion properties of power conditioning module 100 and device 200 may minimize the potential for defects in the electrical connections between power conditioning module 100 and device 200 typically caused during operation because of differences in thermal expansion coefficients. Moreover, using the same material or materials permits the use of the same or similar fabrication techniques and facilities/equipment thereby potentially reducing manufacturing costs.

The interface vias 104a–104h provide electrical connection for signals used by device 200 but not used by power conditioning module 100 in conditioning the power for device 200. In this regard, power conditioning module 100 provides the electrical interconnects for other signals, such as the data and address signals, used by device 200. For example, where device 200 is a microprocessor device, interface vias 104a–104h may provide an electrical pathway, through power conditioning module 100, between the microprocessor and, for example DRAM or SRAM memory devices. Thus, signals from other parts of system 10 (for example, DRAM or SRAM memory devices) may travel or propagate byway of signal traces on printed circuit board 400—through power conditioning module 100—to device 200 by way of interface vias 104–104h.

The interface vias 104a–104h may be fabricated using conventional processing techniques. Where the number of signals that travel to and from device 200 is large, it may be preferable to employ highly anisotropic etching to form narrow pathways in substrate 102 and to deposit (for example, using CVD or LPCVD techniques) a highly conductive material such as gold, copper, aluminum, or highly doped polysilicon into the pathways to facilitate a highly conductive interconnection.

With continued reference to FIG. 2, power conditioning module 100 of this embodiment may further include interface pads 106a–106p to facilitate greater conductivity between power conditioning module 100 and device 200 or board 400. In this regard, the interface pads 106a–106p allow for greater tolerance in mating or interfacing power conditioning module 100 to board 400 and/or device 200. The interface pads 106a–106p may be fabricated using conventional techniques from highly conductive material such as gold, copper or aluminum. In a preferred embodiment, the same material is used for both interface vias 104a–104h and interface pads 106a–106p. Indeed, pads 106a–106p may be fabricated in the same or similar manner and materials as used in ball grid array ("BGA") or chip scale package ("CSP") devices. The term "pad", as used herein, includes the "ball" connection technology used in BGA packages, CSP packages, and the like.

With continued reference to FIG. 2, power conditioning module 100 may also include power and ground vias 108a and 108b to provide a supply voltage, supply current, reference voltages, and/or ground (supply) voltages to electrical circuitry 112. The power and ground vias 108a and 108b may be designed and fabricated in the same manner as interface vias 104a–104h.

It should be noted that, while only two power and ground vias are illustrated, it will be appreciated by those skilled in the art that additional power and ground vias may be employed where necessary or advantageous. Moreover, it should be noted that power and ground vias 108a and 108b may provide other voltages or currents that are necessary for electrical circuitry 112 to perform the functions described herein or any other desirable functions.

The power conditioning module 100 may also include power and ground pads 110a and 110b to enhance electrical conductivity between power conditioning module 100 and printed circuit board 400. The power and ground pads 110a and 110b, like interface pads 106a–106p, permit for greater tolerance or mismatch in mating or interfacing power conditioning module 100 to board 400. The power and ground pads 110a and 110b may be designed and fabricated in the same manner as interface pads 106a–106p.

The power conditioning module 100 also includes electrical circuitry 112. The electrical circuitry 112 delivers the conditioned power to device 200. In particular, electrical circuitry 112 provides appropriate conditioning of the voltage parameters (for example, supply voltage and ground) and current parameters (for example, supply, peak and typical operating currents) required by device 200 so that the voltage and current available to device 200 during, for example, normal operation, standby, start-up and/or shutdown, are within the ranges or tolerances required for proper and reliable operation. The electrical circuitry 112 may include voltage regulators, bypass capacitors, DC—DC converters, and/or AC-DC converters arranged, configured, designed and interconnected using conventional techniques and designs (for example, conventional CMOS or BJT design and fabrication techniques). A brief overview of these elements is provided in the background of the invention and, for the sake of brevity, will not be repeated here.

Importantly, by locating electrical circuitry 112, such as voltage regulators, bypass capacitors, ferrite beads, DC—DC converters, and/or AC-DC converters near device 200, the considerations identified above regarding power conditioning are addressed. In addition, the horizontal and vertical space consumed by electrical circuitry 112 is considerably reduced in relation to the conventional techniques and systems illustrated in FIG. 1 and contemplated in U.S. Pat. No. 6,285,550. Moreover, locating power conditioning module 100 on or near thermal management module 300 facilitates efficient capture and rejection of heat generated by electrical circuitry 112 in power conditioning module 100.

The electrical circuitry 112 illustrated in FIG. 2 is disposed on the first interface of substrate 102. This embodiment may facilitate interfacing with the electrical power and ground inputs of device 200. However, it should be noted that electrical circuitry 112 may also be disposed on the second interface as illustrated in FIG. 4. This configuration may, for example, enhance the thermal capture and rejection capabilities with respect to the electrical circuitry of power conditioning module 100 and enhance signal conductivity between device 200 and signal traces on printed circuit board 400. In addition, the configuration illustrated in FIG. 4 may also suite the packaging requirements of device 200 and reduce the thermal exchange between power conditioning module 100 and consuming device 200. The embodiment of FIG. 4 may also accommodate manufacturing constraints of electrical circuitry 112 of power conditioning module 100.

The electrical circuitry 112 may also be disposed on both the first and second interfaces. A layout having electrical circuitry 112 disposed on the first and second interfaces may provide many of the advantages of both FIGS. 3 and 4.

While it is contemplated that the power conditioning requirements of device 200 are satisfied by power conditioning module 100, it should be noted that additional discrete electrical power conditioning elements (for example, by-pass capacitors (not shown) to provide filtering, in addition to that performed by power conditioning module 100, also may be employed and disposed in manners similar to that of conventional systems. Under this circumstance, power conditioning module 100 does not perform all power conditioning functions of system 10. Rather, power conditioning module 100 performs power conditioning in conjunction with discrete electrical power conditioning elements. These discrete electrical power conditioning elements may perform initial and/or supplemental conditioning of the voltage and current. For example, a system may include a primary power supply (having discrete components) to provide initial power conditioning of an externally supplied power. The power conditioning module 100, in turn, provides localized power conditioning of the power for device 200. In this embodiment, the primary power supply may provide initial power conditioning for a plurality of devices in the system, including device 200 (See, for example, FIG. 24). Thus, many of the advantages of power conditioning module 100 are still realized, however, the additional discrete electrical power conditioning elements may increase the footprint of the power conditioning of the overall system.

The reference voltages and currents used by electrical circuitry 112 may be provided or routed to the particular elements (for example, voltage regulators) of electrical circuitry 112 in many ways. For example, with reference to FIG. 5, in one embodiment, the voltage and current may be provided to electrical circuitry 112 using power and ground conduits 114a and 114b that are embedded within semiconductor substrate 102. The power and ground conduits 114a and 114b extend from power and ground vias 108a and 108b and connect to electrical circuitry 112 as dictated by the specific power conditioning circuit design implemented. In this embodiment, power and ground vias 108a and 108b need not extend the entire length of semiconductor substrate 102 (as illustrated in FIG. 2) since power and ground conduits 114a and 114b connect well within substrate 102. The power and ground conduits 114a and 114b may be fabricated using conductive materials (for example, gold, copper, aluminum or a highly doped polysilicon) and deposited using conventional semiconductor processing or fabrication techniques (for example, conventional photolithography, etching and deposition processes).

Figure 6:
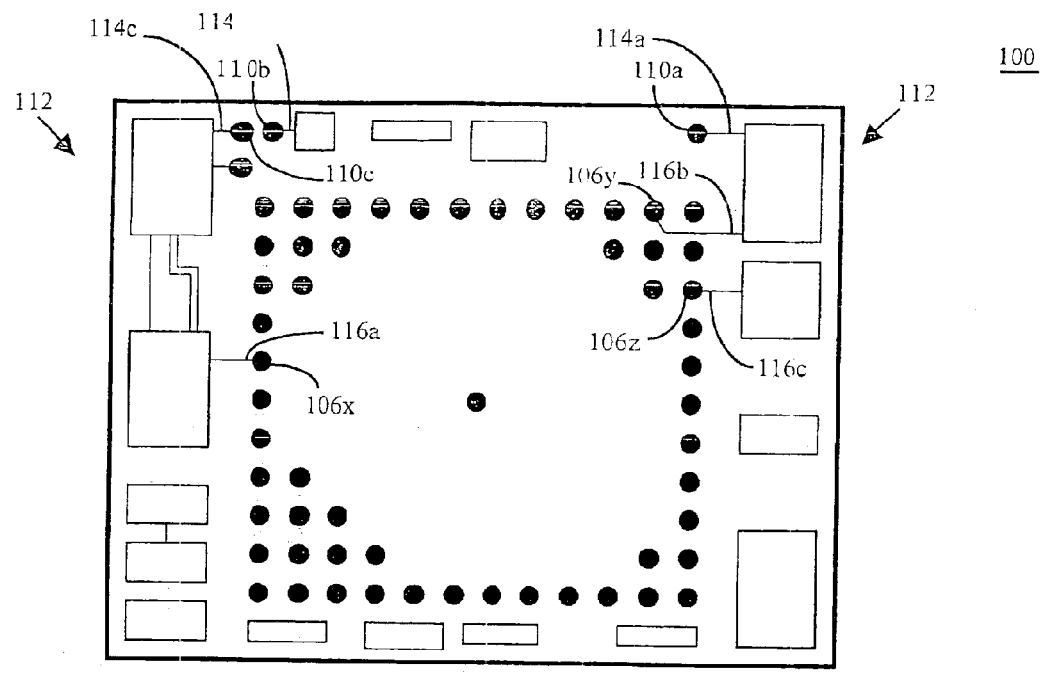
FIG. 6 is a block diagram representation of a top view of the interface of the power conditioning module according to one aspect of the present invention.

With reference to FIG. 6, power and ground conduits 114a and 114b may also be formed more towards the interface of semiconductor substrate 102 (but still in substrate 102). In this embodiment, power and ground vias 108 and 108b may extend the entire or nearly the entire length of semiconductor substrate 102 since power and ground conduits 114a and 114b connect to electrical circuitry 112 nearer the surface of the interface of substrate 102. The power and ground conduits 114a and 114b of FIG. 6 extend from power and ground vias 108a and 108b (not illustrated in FIG. 6) and connect to electrical circuitry 112 which is also fabricated near the interface of substrate 102. The power and ground conduits 114a and 114b may be fabricated using conventional processing or fabrication techniques from conductive materials (for example, gold, copper, aluminum or a highly doped polysilicon).

Figure 7:
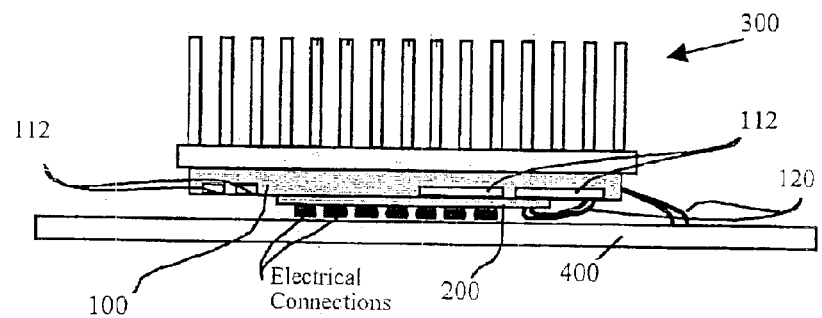
FIG. 7 is a block diagram representation of an embodiment of a power conditioning and thermal management module according to one aspect of the present invention incorporated in an integrated circuit application.

Another alternative for supplying power and ground to electrical circuitry 112 is illustrated in FIGS. 4 and 7. In these embodiments, power and ground are provided to electrical circuitry 112 using conventional wire bonding techniques that employ conventional wires 120 and bond pads 122 as illustrated in FIG. 4. Those skilled in the art will appreciate that there are many techniques for providing power and ground connections from board 400 (or a power supply, not shown) to electrical circuitry 112. All techniques for providing power and ground connections to and from electrical circuitry 112, whether now known or later developed, are intended to be within the scope of the present invention.

As mentioned above, electrical circuitry 112 conditions the power, in a conventional manner, and delivers the required power to device 200. The electrical circuitry 112 (for example, voltage regulators, bypass capacitors, DC—DC converters, and/or AC-DC converters) may be arranged and interconnected using conventional techniques and designs (for example, conventional CMOS and/or BJT circuit designs to accomplish the necessary power conditioning functions) to provide device 200 with the appropriate voltage and current during all aspects of operation as well as during start-up, standby and shutdown.

The output power and/or ground of power conditioning module 100 may be provided or routed to device 200 using techniques similar to those used in providing electrical circuit 112 with the "unconditioned" power and ground from board 400 (or power supply, not shown). In this regard, with reference to FIG. 5, in one embodiment, electrical circuitry 112 supplies the conditioned power and/Dr ground to device 200 using output power conduit 116a, output ground conduit 116b, output power via 118a, and output ground via 118b. Signal traces may then provide electrical connection between output power and ground conduits 116a and 116b to power and ground inputs of device 200.

Figure 5:
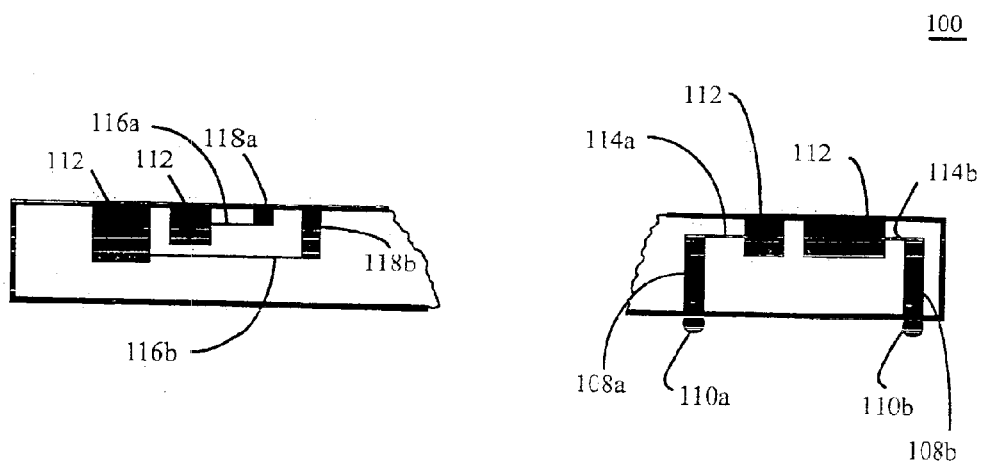
FIG. 5 is a cross-sectional view of a discrete power conditioning module, including power and ground conduits, in accordance with an aspect of the present invention.

Alternatively, with continued reference to FIG. 5, output power and output ground conduits 116a and 116b may be directly routed to the specified pads on the interface of substrate 102 that match or correspond to the power and ground inputs of device 200. In this embodiment, vias 118a and 118b may be eliminated because output power and ground conduits 1116a and 116b are routed to the appropriate power and ground inputs of device 200 without an intermediate connection. For example, the output power and/or ground of power conditioning module 100 may be routed to device 200 in the manner illustrated in FIG. 6.

With reference to FIG. 6, output power and ground conduits 116a, 116b and 116c are formed in substrate 102 using conventional fabrication techniques and routed to a predetermined pads 106x, 106y and 106z which corresponds to power or ground inputs of device 200. In this embodiment, there may be no need for output power and ground vias 118a and 118b since output power and ground conduits 116a and 116b are routed directly to specified pads 106x, 106y and 106z on the interface of substrate 102 that match or correspond to the power and ground inputs of device 200. The power and ground conduits 116a and 116b may be fabricated from electrically conductive materials (for example, gold, copper, aluminum or a highly doped polysilicon).

Further the output power and ground of power conditioning module 100 may also be routed to device 200 in the manner illustrated in FIG. 7. In this embodiment, output power and ground are provided to device 200 using conventional wire bonding techniques. In short, conventional wires 120 (and bond pads, not shown) interconnect the output of power conditioning module 100 to the appropriate inputs of device 200.

It should be noted that power conditioning module 100 may be fabricated using a 2-stage process, in which vias 104 and 108 (and other elements, for example power and ground conduits 114 and 116) are formed first and electrical circuitry 112 fabricated using conventional CMOS or BJT processing is formed second. Indeed, it should be understood that any techniques for fabricating (as well as the materials used therein) power conditioning module 100 now known or later developed are intended to be within the scope of the present invention.

Moreover, it should also be noted that with respect to all of the embodiments described herein, those skilled in the art will recognize and understand that there are many other suitable techniques for providing the conditioned or output power and ground from electrical circuitry 112 to device 200. Indeed, it should be understood that any techniques for designing and fabricating the pads, vias, conduits, electrical circuitry and wire bonds now known or later developed are intended to be within the scope of the present invention; in addition, it should be understood that any materials used therein for the substrate, pads, vias, conduits, electrical circuitry, and wire bonds which are now known or are later developed are intended to be within the scope of the present invention.

The present invention is advantageously suitable for use in space-constrained environments. In this regard, locating the power conditioning elements in essentially the same basic footprint as the integrated circuit device permits the space around the integrated circuit device to be used for other purposes. For example, external static or dynamic memory may be located closer to the microprocessor thereby reducing the flight times of signals communicating with the memory. This may result in faster system operation.

The power conditioning module 100 may be located between device 200 and board 400 as illustrated in FIG. 3. In this embodiment, a configuration of power conditioning module 100 as illustrated in FIG. 2 is more suitable because the vias, among other things, facilitate electrical connection for those signals used by device 200 (Out not by power conditioning module 100), for example data and address signals for DRAM or SRAM memory devices.

Alternatively, power conditioning module 100 may be located between device 200 and thermal management module 300 as illustrated in FIGS. 4 and 7. In light of the active electrical layer (for example, electrical circuitry 112) of power conditioning module 100 being separated from board 400, it is necessary to form discrete electrical connections from the active electrical layer to board 400. As mentioned above, this may be accomplished using wire bonds 120 as illustrated in FIGS. 4 and 7, or by using other known or later developed interconnect technologies, all of which are intended to be within the scope of the present invention.

Under certain circumstances, it may be advantageous to locate thermal management module 300 remotely from the other elements of system 10. In this regard, thermal management module 300 may be a fan that causes air to travel over the elements of system 10 and thereby remove the heat generated by module 100 and device 200. Such a configuration facilitates use of system 10 in a space-constrained environment yet provides sufficient power conditioning in a small footprint. In this embodiment, the remotely located thermal management module 300 may be placed in an area having sufficient volume for a fan, without interfering with other system needs for placement of peripherals, such as memory or data storage, in close proximity to device 200.

Further, in certain implementations, it may be advantageous to implement a more compact thermal management module 300 than a conventional fin-array heat sink as illustrated in FIG. 3. For example, as will be discussed below, it may be advantageous to employ a thermal capture element having a micro channel structure to capture and remove heat generated by device 200 and/or electrical circuitry 112. The heat energy may then be rejected by a heat rejection element that is either local or remote relative to device 200. Indeed, it should be understood that any techniques known or later developed for heat capture and rejection apparatus or sub-system, including any of those described herein, are intended to be within the scope of the present invention.

Finally, under certain circumstances, thermal management module 300 may be unnecessary altogether. For example, the introduction of "cool chips" such as the "Crusoe" processor from Transmeta Inc., feature low thermal profiles. As such, system 10 may be implemented in a space-constrained environment for example, portable or handheld devices), due to its small footprint, and be unconcerned with thermal capabilities and space considerations of thermal management module 300.

In another aspect, the present invention is an integrated power and thermal management module that incorporates the functions of the power conditioning element (i.e., power conditioning) and the thermal management element (i.e., heat capture, removal and/or rejection) into a single structure. In contrast, in the previously discussed embodiments, the modules for power conditioning and heat capture, removal and rejection were separate structures that were stacked, with device 200, in various configurations to form a 3-layer structure. In this aspect of the invention, the power conditioning element and the thermal management element are incorporated into a single structure. As such, additional advantages (beyond those advantages described above) may be realized including, for example, a significant reduction in the total volume occupied and direct physical contact may be achieved between the consuming device, the power conditioning module and the thermal management module—thereby facilitating enhanced thermal capture and rejection for the power conditioning structure and/or the consuming device.

This aspect of the invention also provides unique packaging configurations of the combined power conditioning and thermal management module—consuming device structure. It should be noted that since the consuming device and the power conditioning module capitalize on the thermal management capabilities of the integrated power conditioning and thermal management module, additional heat capture and rejection elements may be unnecessary. This may be important because, in some instances, the operational temperatures of the power conditioning module may approach that of device 200.

Moreover, "miniaturizing" the thermal management element facilitates implementation of the integrated power conditioning and thermal management module in highly space-constrained environments. Where the heat capture and heat rejection aspects of the thermal management element of module 1000 are separated such that the thermal capture functions are integrated into a single structure with the power conditioning functions, that single structure (i.e., power conditioning and thermal management module 1000 as in FIG. 8) may be implemented within the packaging of an integrated circuit device. (See, for example, FIG. 11). The heat rejection functions may be accomplished using a heat sink disposed on a surface of the device/package or located distant from the device/package.

Figure 8:
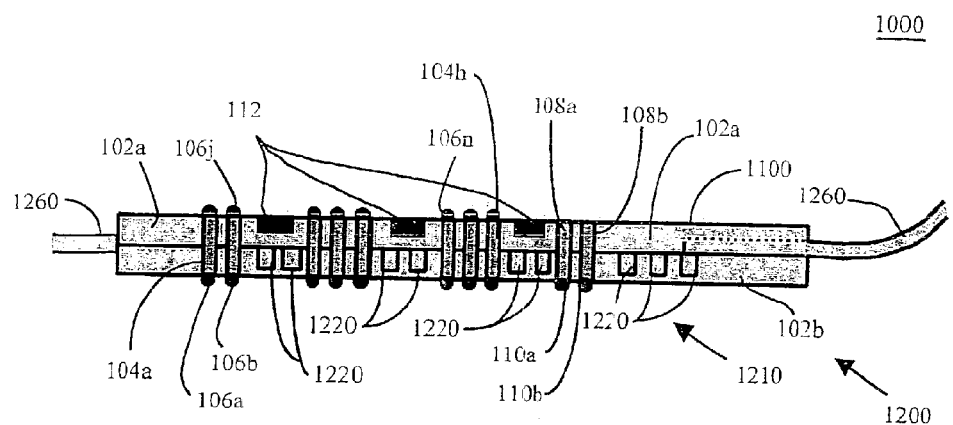
FIG. 8 is a cross-sectional view of a power conditioning and thermal management module in accordance with one aspect of the present invention.
Figure 9:
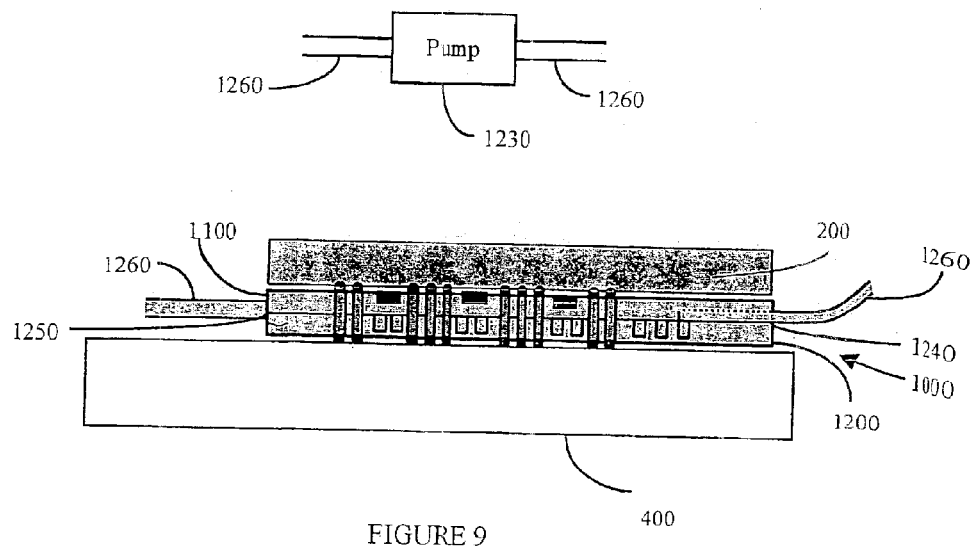
FIG. 9 is a block diagram representation of the power conditioning and thermal management module of FIG. 8 incorporated in an integrated circuit application.

With reference to FIGS. 8 and 9, power conditioning and thermal management module 1000 includes power conditioning element 1100. The power conditioning element 1100 may be substantially similar to power conditioning module 100 of FIGS. 2–7 and may include, for example, vias, pads, and electrical circuitry as described above. For the sake of brevity, the details and functions of power conditioning element 1100 will not be repeated here.

The power conditioning and thermal management module 1000 also includes thermal management element 1200. Thermal management element 1200 captures and removes the heat generated by device 200 and/or power conditioning element 1100 so that the temperature of device 200 and/or power conditioning element 1100 does not exceed a given temperature. The thermal management element 1200 may also reject the heat. Thus, in operation, thermal management element 1200 captures the heat generated by device 200 and power conditioning element 1100 and removes that heat so that it may be dispersed in the surrounding environment by convection or a heat rejection element (for example, a conventional heat sink).

Power conditioning and thermal management module 1000 may include substrate 102a, in which a substantial portion of power conditioning element 1100 is formed, and substrate 102b, in which a portion of thermal management element 1200 is formed. The two substrates may be bonded by, for example, anodic or fusion bonding, or eutectic bonding, or adhesive bonding for glass and semiconductor structures. Employing metal structures permits bonding by welding, soldering, eutectic bonding, or adhesives. The combined substrates 102a and 102b form power conditioning and thermal management module 1000.

In this configuration, interface vias that provide electrical connection between signal traces on printed circuit board 400 and inputs/outputs of device 200 may be fabricated in two steps. A separate set of interface vias are formed in each of the substrates of power conditioning element 1100 and thermal management element 1200. Thereafter, when the two substrates are bonded, a corresponding one of the interface vias in substrate 102a mates with a corresponding one of the interface vias in substrate 102b to form the interface via for module 1000.

To enhance the electrical continuity between the interface vias in substrate 102a and 102b, intermediate interface pads may be disposed on each of the mating interfaces of substrate 102a and 102b. The pads on each mating interface, after the two substrates are bonded contact a corresponding pad on the other mating interface. This configuration allows for greater tolerance when mating or interfacing power conditioning element 1100 and thermal management element 1200 and, as such, may enhance the electrical continuity between the exposed interfaces of power conditioning and thermal management module 1000 when the bonded substrates are not perfectly aligned.

Moreover, in those instances where external power is provided to power conditioning element 1100 by way of power and ground vias, the same fabrication techniques described above may be employed to fabricate the power and ground vias. However, in those instances where external power is provided to power conditioning element 1100 by way of wire bonds, power and ground vias may not be necessary.

With continued reference to FIGS. 8 and 9, in one embodiment, thermal management element 1200 includes a micro channel heat exchanger 1210 having a plurality of micro channels 1220. The micro channel heat exchanger 1210 also includes pump 1230, fluid inlet 1240, fluid outlet 1250, and tubing 1260 to provide a fluid to micro channels 1220.

Figure 10A:
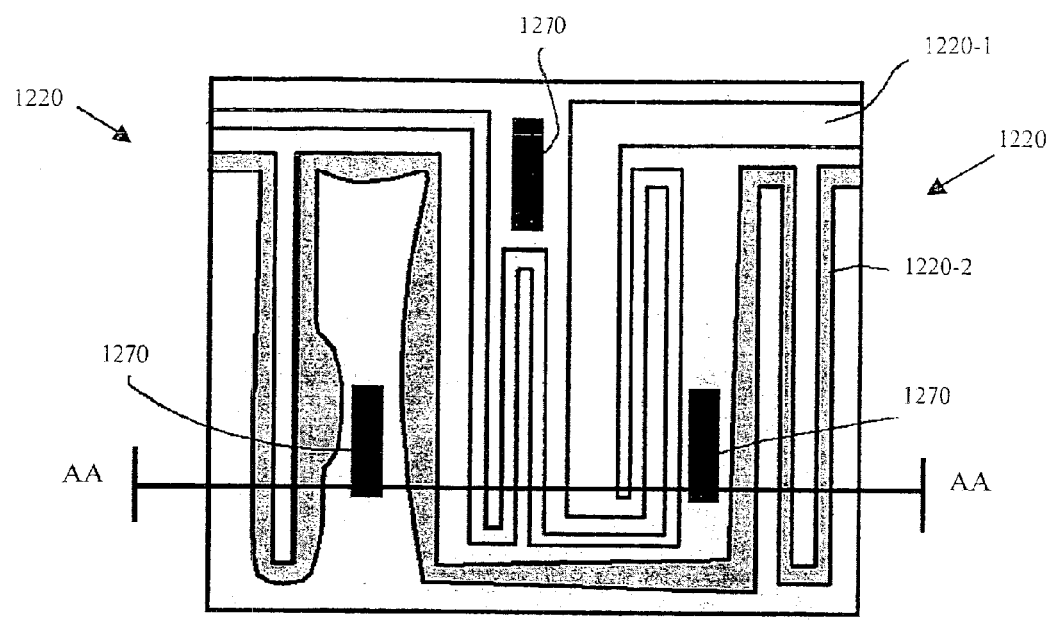
FIG. 10A is a top of a micro channel configuration of a thermal management element in accordance with one aspect of the present invention.
Figure 10B:
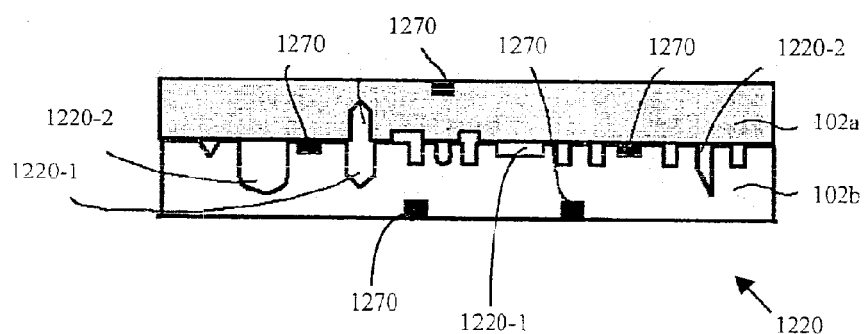
FIG. 10B is a cross sectional view, along line AA, of the micro channel configuration of a thermal management element illustrated in FIG. 10A.

With reference to FIGS. 10A and 10B, micro heat exchanger 1210 may be, for example, a micro fabricated semiconductor substrate, machined metal substrate, or machined glass substrate. FIGS. 10A and 10B illustrate a top and cross sectional view, respectively, of an exemplary micro channel structure 1220. The substrate of thermal management element 1200 includes a pattern of micro channels 1220-1 and 1220-2 etched into an interface. The micro channels 1220-1 and 1220-2 maybe arranged on the interface of thermal management element 1200 according to the needs for heat removal from particular regions of power conditioning element 1100. The density of micro channel structure 1220 may be increased in regions that correspond to anticipated or measured sources of excessive heat, or the routing of micro channels. 1220-1 and 1220-2 may be designed to reduce and/or minimize temperature gradients from the inlet to the outlet of micro heat exchanger 1210. The widths, depths, and shapes of micro channels 1220-1 and 1220-2 may also be designed and fabricated to improve device temperature uniformity or address a hot spot on device 200 and/or power conditioning element 1100. Indeed, the shape and arrangement of micro channel structure 1220 may be designed or determined through the assistance of thermal modeling tools described in a U.S. patent Application entitled "Electroosmotic Microchannel Cooling System", filed by Kenny, et al. on Jan. 19, 2002. Many different types of arrangements, layouts and configurations of micro heat exchanger 1210 and micro channels 1220-1 and 1220-2 are described and illustrated in the U.S. patent Application filed by Kenny et al. on Jan. 19, 2002.

The U.S. patent Application filed by Kenny et al. on Jan. 19, 2002 (entitled "Electroosmotic Microchannel Cooling System") has not yet been assigned an Application Serial Number. The Kenny et al. U.S. patent Application will be referred to hereinafter as "the Kenny et al. Application"). The Kenny et al. Application is hereby incorporated, in its entirety, by reference herein.

It should be noted that micro channels 1220 may also extend into the interface of power conditioning element 1100 as well. In addition, micro channel structure 1220 may be formed on both the first and second mating interfaces of thermal management module 1100. In this embodiment, micro heat exchanger 1210 may more efficiently capture and remove heat from both device 200 and power conditioning element 1200 due, in part, to more intimate physical contact between the heat exchanger 1210 and both device 200 and power conditioning element 1200.

The micro heat exchanger 1210 may also include more than one fluid path, as illustrated in FIG. 10A, by micro channels 1220-1 and 1220-2. These independent paths may be connected to different pumps 1230 and/or different heat rejection elements 1410, according to the particular needs and/or designs of the application. As mentioned above, many different types of arrangements, layouts and configurations of micro heat exchanger 1210 and micro channels 1220-1 and 1220-2, including the multiple independent micro channel configuration, are described and illustrated in the Kenny et al. Application, which are again hereby incorporated by reference.

The pump 1230 may be any type of pumping device that provides the flow and pressure necessary to capture the heat generated in device 200 and/or power conditioning element 1100. In this regard, pump may be an electro-osmotic type pumping device like that described and illustrated in the Kenny et al. Application. The electro-osmotic type pumping device is not discussed in detail here, rather the corresponding discussion in the Kenny et al.; Application is incorporated herein by reference.

Figure 17A:
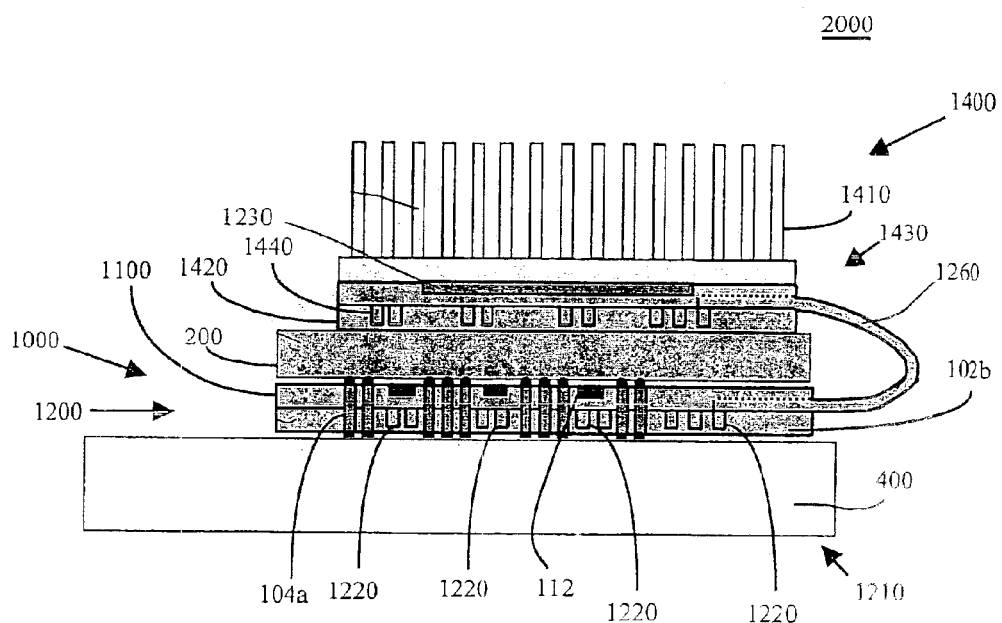
FIG. 17A is, a block diagram representation and cross-sectional view of an embodiment of the integrated power conditioning and heat capture/rejection module of FIG. 16, in conjunction with a discrete heat capture/rejection module, incorporated in an integrated circuit application.
Figure 17B:
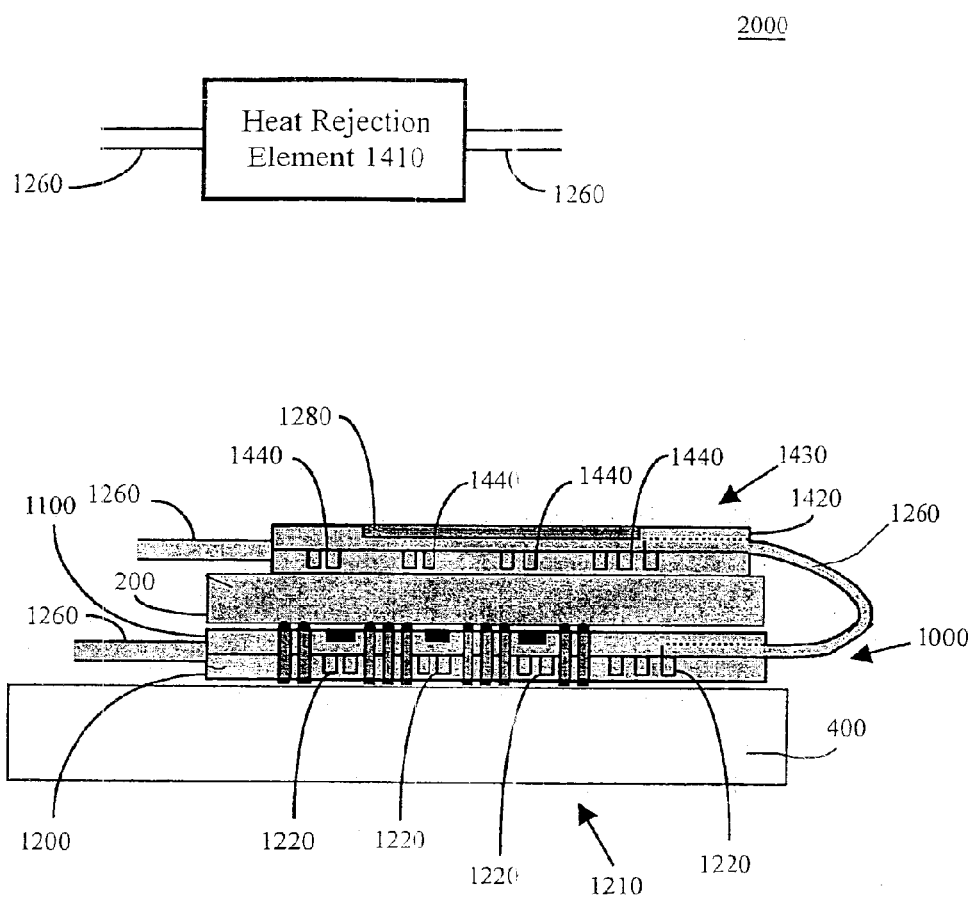
FIG. 17B is a block diagram representation and cross-sectional view of an embodiment of the integrated power conditioning and heat capture/rejection module of FIG. 16, in conjunction with a discrete thermal capture element, incorporated in an integrated circuit application.

The power conditioning and thermal management module 1000 of FIGS. 8 and 9 facilitates efficient packaging of power conditioning element 1100 in close proximity to device 200, and provides an additional advantage that the heat generated by power conditioning element 1100 and/or device 200 is captured within, and removed by thermal management element 1200. Further, by positioning the power conditioning and heat capture elements within a single module beneath device 200, a surface (for example, the top or upper surface) of device 200 is available for other modes of access, such as optical or RF telecommunications, and/or for placement of memory devices. This positioning also permits that surface of device 200 to be used for other functions, including, for example, additional thermal management elements such as a heat sink as illustrated in FIG. 3 or a second thermal management element as illustrated in FIGS. 17A and 17B.

In addition, power conditioning and thermal management module 1000 of FIGS. 8 and 9 facilitates efficient packaging as a discrete device. In this regard, with reference to FIGS. 11 and 12A, module 1000 may be incorporated into a typical electronic package 1300, having pins 1310, that is modified to accommodate fluid required for thermal management element 1200.

Figure 11:
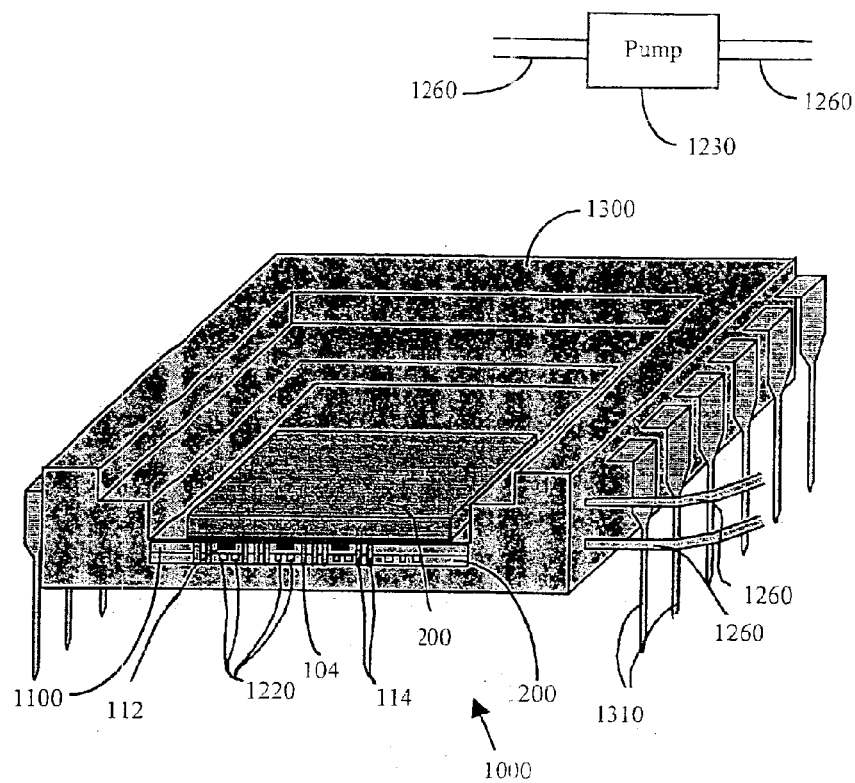
FIG. 11 is a block diagram representation of another embodiment of the power conditioning and thermal management module, incorporated in a dual-in-line package, face-down integrated circuit application.

The device 200 illustrated in the embodiment of FIG. 11 may employ a conventional face-down, ball-bond mounting configuration to an electrical interconnect array. The device 200 may be mounted to power and thermal management module 1000 in a manner similar to that described above with respect to the embodiment illustrated in FIGS. 2–7. Employing a face-down, ball-bond mounting configuration for device 200 provides several additional advantages, including, for example, providing intimate contact between device 200 with the heat capture capabilities of thermal management element 1200 (and the fluid-filled micro channels 1220); and permitting back-surface access to device 200 for other purposes, as described above.

Figure 12A:
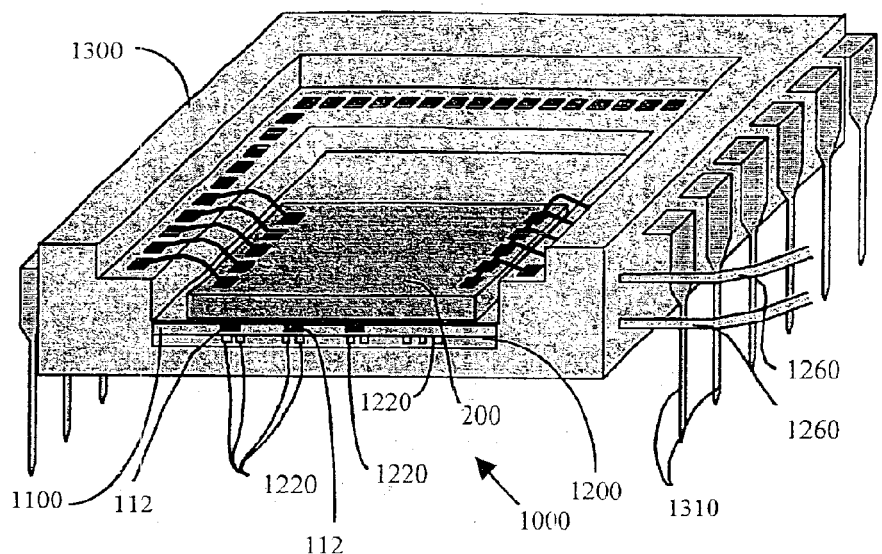
FIG. 12A is a block diagram representation of another embodiment of the power conditioning and thermal management module, incorporated in a dual-in-line package, face-up integrated circuit application.

The device 200 illustrated in the embodiment of FIG. 12A may employ a conventional face-up, wire bond mounting configuration where wire bonds provide connection from device 200 to package 1300. In this embodiment, the interconnect vias are unnecessary since conventional wire bonding techniques provide the electrical connection to device 200. However, this embodiment provides several significant advantages, including, for example, incorporation of power conditioning and heat capture elements into package 1300 thereby providing close proximity of power conditioning element 1100 to device 200. In addition, this embodiment provides an advantage of providing intimate contact between device 200, power conditioning element 1100 and thermal management element 1200 so that energy (in the form of heat) generated by device 200 and/or powder conditioning element 1100 may be efficiently captured (by the fluid in micro channels 1220) are removed from package 1300. A further advantage of the embodiment in FIG. 12A is that the operating surface, of device 200 is optically accessible, which would be suitable for use by another device, for example, an electro-optic device, such as a modulator, a display device, an optical imaging device, such as a CCD, and/or an optical switch.

Figure 12B:
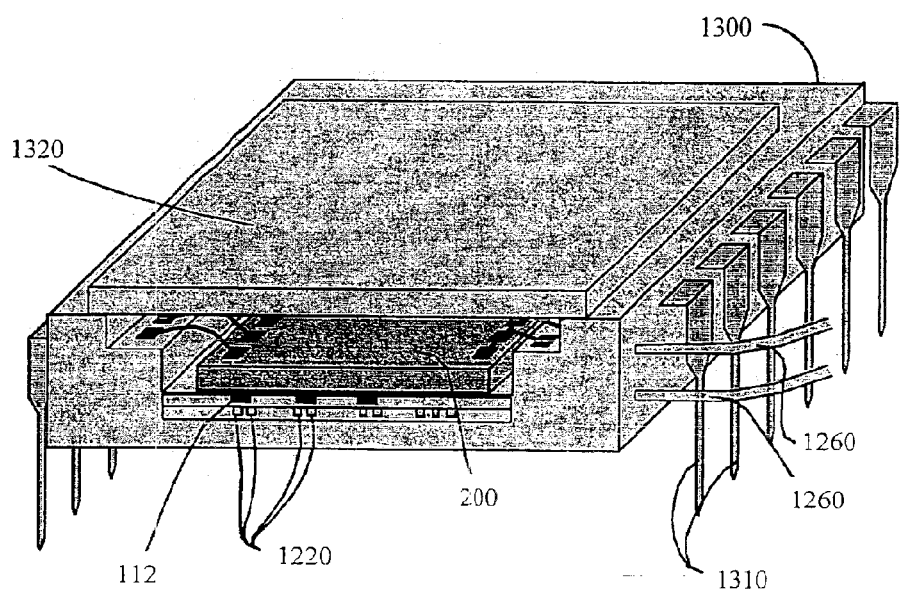
FIG. 12B is a block diagram-representation of the embodiment of the power conditioning and thermal management module, incorporated in a dual-in-line package, face-up integrated circuit application of FIG. 12A in conjunction with a package lid.

Under those circumstances where device 200 is to be implemented in a harsh environment, it may be advantageous to hermetically-seal package 1300. As illustrated in FIG. 12B, a lid 1320 may be attached to package 1300 thereby providing a hermetically-sealed environment with integrated power conditioning and thermal management capabilities of module 1000 in intimate contact with device 200. The lid 1320 may be opaque, as would be appropriate for an opto-electronic device, or lid 1320 may be transparent in the infrared or visible spectrums, as would be appropriate for a display device, or an imaging device. Integration of the power and thermal management functions within this package may allow optimal operation of thermally-sensitive devices, such as imaging arrays.

Figure 13:
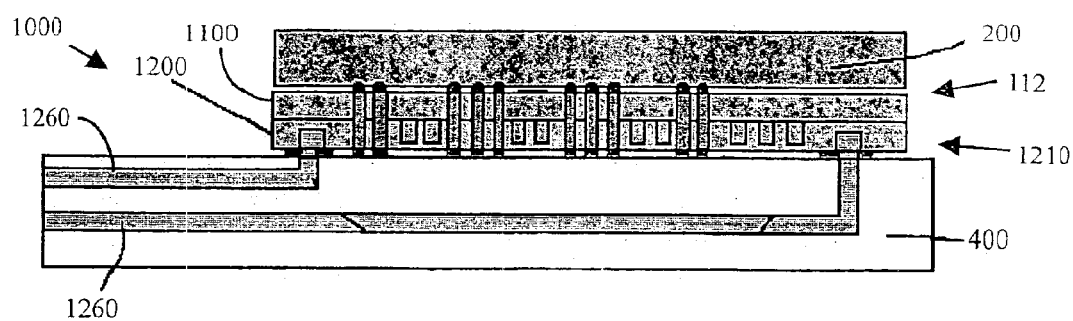
FIG. 13 is a cross-sectional view of another embodiment of the power conditioning and thermal management module, mounted on a printed circuit board, in accordance with the present invention.

Under those circumstances where device 200 is to be mounted directly onto a substrate (for example, printed circuit board 400), it may be advantageous to supply the working fluid to thermal management element 1200 by way of channels fabricated in the substrate to which the module 1000 is affixed. With reference to FIG. 13, the working to fluid is provided to micro heat exchanger 1210 from beneath power conditioning and thermal management module 1000 using channels or tubing 1260 that are embedded or formed in the substrate. Press fits, solder and/or adhesives may secure the channels or embedded tubing 1260 directly to fluid inlet (not shown) and fluid outlet (not shown) of micro heat exchanger 1210. The configuration of FIG. 13 may facilitate implementation of module 1000 in a chip pick-place assembly process.

It should be noted that there are many possible techniques of attaching channel or tubing 1260 to module 1000, including, for example, formation of openings in module 1000 to permit tubing segments and/or other couplings to be inserted into module 1000 and bonded into place. These bonds may be press-fits, or utilize solder or adhesives. Alternatively, it is possible to form openings in module 1000 on the top or bottom surfaces, and to bond a fitting to one or both of these surfaces over the opening(s) with a port for connecting the tube. Indeed, all techniques, now known or later developed, for securing embedded channels or tubing 1260 to the fluid inlet and outlet of micro heat exchanger 1210 are intended to be within the scope of the present invention.

The embedded channel configuration of FIG. 13 also may be employed in those circumstances where the consuming device and power conditioning and thermal management module 1000 are packaged and that package is affixed to a substrate. As illustrated in FIG. 13, the working fluid may be provided to the micro heat exchanger of power conditioning and thermal management module using channels or tubing that are embedded or formed in the substrate to which the consuming device is affixed. The fittings may be employed to secure the channels (or embedded tubing) directly to the fluid inlet and outlet of the micro heat exchanger or the fluid inlet and outlet of the package. In those circumstances where the channels (or embedded tubing) are connected to the fluid inlet and outlet of the package, tubing or channels embedded or formed in the package may provide the interconnection between the channels (or tubing) in the substrate and the fluid inlet and outlet of the micro heat exchanger.

Figure 14:
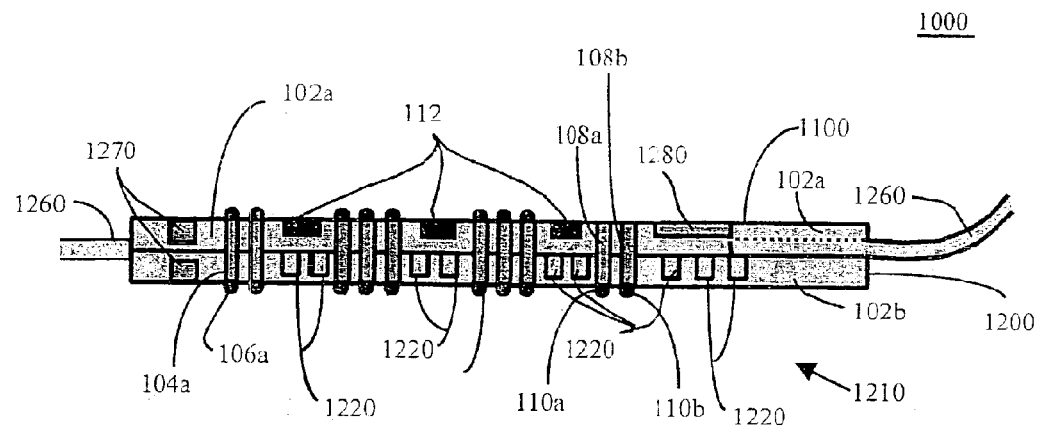
FIG. 14 is a cross-sectional view of another embodiment of the power conditioning and thermal management module of the present invention.
Figure 15:
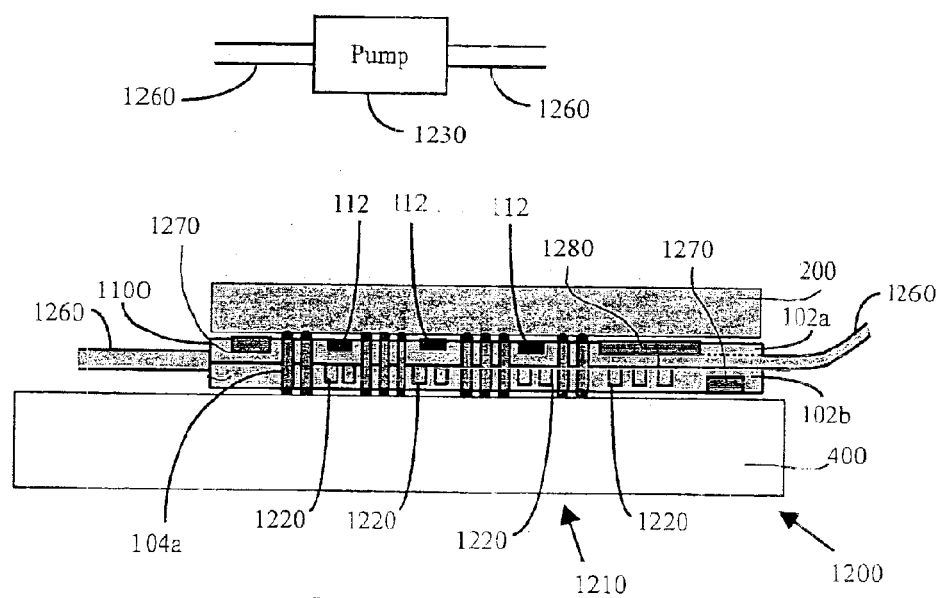
FIG. 15 is a block diagram representation of an embodiment of the power conditioning and thermal management module of FIG. 12 incorporated in an integrated circuit application.

The power and thermal management module 1000 may also include circuits or devices that provide information regarding the operating parameters of module 1000 for more efficient and responsive cooling and power conditioning. With reference to FIGS. 14 and 15, power and thermal management module 1000 of this embodiment additionally includes sensors 1270 (for example, temperature, pressure and flow sensors) and controller 1280. The sensors 1270 provide information that is representative of the operating conditions of device 200 and module 1000 (for example, operating temperature). The signals from sensors 1270 may be routed to controller 1280 to provide a closed-loop control of the functionality of power and thermal management module 1000.

In particular, where sensors 1270 include a temperature measuring sensor, controller 1280 may use information provided by the temperature sensor to modify or adjust the operation of thermal management element 1200, power conditioning element 1100 and/or device 200. Under these circumstances, power conditioning and thermal management module 1000 is being operated in a thermal control mode, in which the temperature variations measured by one or more temperature sensors that are distributed throughout module 1000 are provided as feedback signals to controller 1280. The controller 1280 may use the information provided by sensors 1270 to determine, for example, the average temperature of module 1000 and/or device 200 and spatial variations in temperature with respect to module 100 and/or device 200. In response to this information, controller 1280 may adjust the fluid flow rate through micro channels 1220 of micro channel heat exchanger 1210. The controller 1280 may adjust the rate of fluid flow in micro channels 1220 by controlling the operation of pump 1230 or by adjusting the distribution of the fluid through the different channel manifolds of micro channel heat exchanger 1210.

In addition, controller 1280, after determining a temperature sensitive condition, may alert device 200 that it may exceed (or has exceeded) its normal operating temperature. In response device 200 may initiate a low power mode in order to lower its operating temperature and power consumption. Consuming less power will result in less heat generation by device 200 as well as power conditioning element 1100. The device 200, in response to information regarding its operating temperature, may enter a system shut down process as a protective measure. Other actions in response to changes in temperature are described in the Kenny et al. Application, which are hereby incorporated by reference herein.

The placement or location of sensors 1270 (for example, temperature, pressure, and/or flow sensors) within substrates 102a and 102b may be based on many factors. For example, there may be advantages to place the temperature sensors laterally with respect to the micro channels 1220 and the anticipated or measured sources of heat of electrically circuitry 112 and/or device 200. Moreover, there may be advantages to placement of temperature sensors at different depths (vertical locations) in substrates 102*a* and 102*b*. FIGS. 10A, 10B, 14 and 15 illustrate sensors 1270 disposed in various locations in power conditioning element 1100 and thermal management element 1200. The sensors 1270 provide information indicative of the operating conditions (for example, temperature) of a specific region(s) of device 200 and module 1000 to controller 1280.

A detailed discussion of sensors 1270, their operation, and considerations regarding their placement or location, is provided in the Kenny et al. Application, which is hereby incorporated by reference herein.

It should be noted that although the embodiments of FIGS. 9 and 15 illustrate one pump, namely, pump 1230, power and thermal management module 1000 may include more than one pumping mechanism. Additional pumping mechanisms may be implemented to provide more immediate and direct control of fluid flow in particular regions of module 1000. This may be important in those situations where there are expected hotspots in device 200 and/or power conditioning elements 1100. For example, more than one pump may be implement in configuration where micro heat exchanger 1210 includes separate and independent micro channels 1220 paths, as illustrated in FIG. 10A. Additional embodiments employing more than one pumping mechanism are described in detail in the Kenny et al. Application, which is hereby incorporated by reference herein.

Thus, to briefly summarize, power and thermal management module 1000 of FIG. 15, provides, among other things, power conditioning functions for device 200, and cooling functions for maintaining device 200 and/or power conditioning elements 1100 within acceptable temperature ranges. The controller 1280, in conjunction with sensors 1270, permits analysis and detection of changes in the operating parameters of device 200 and power and thermal management module 1000. Such changes may result from changes in the power usage by device 200. In response, thermal management element 1200 may adjust the cooling capability (by, for example, control signals to the fluid pump(s) to increase the rate of fluid flow) in order to maintain the temperature of device 200 within acceptable temperature ranges.

Figure 16:
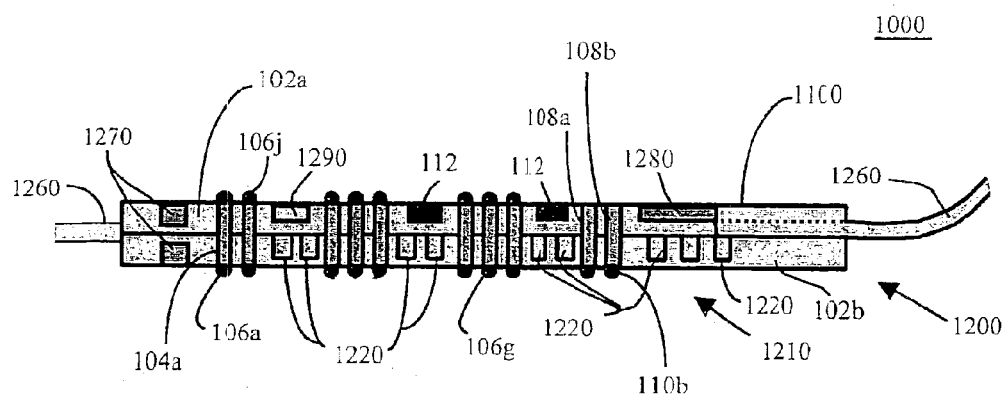
FIG. 16 is a cross-sectional view of another embodiment of the power conditioning and thermal management module of the present invention.

The power and thermal management module 1000 may also include current sensors to detect the current consumption of device 200. With reference to FIG. 16, current sensor 1290 may be embedded in semiconductor substrate 102*a* to provide information which is representative of the current consumption of device 200 and/or electrical circuitry 112 to controller 1280. The controller 1280 may use the detected current consumption to modify the operation of thermal management element 1200. For example, in response to a change in demand of current detected by current sensor 1290, controller 1280 may adjust the fluid cooling capability of thermal management element 1200 by increasing or decreasing the fluid flow of pump 1230. In this embodiment, by detecting and analyzing changes in current demand by device 200, controller 1280 may anticipate a change in temperature of device 200 and/or power conditioning element 1100.

With continued reference to FIG. 16, current sensor(s) 1290 may also detect the current passing through electrical circuitry 112 of power conditioning element 1100 (for example, the voltage regulation devices). The current passing through electrical circuitry 112 may be representative of the current and/or power consumption or demand of device 200. The controller 1280 may use the information from sensor(s) 1290 to determine appropriate actions to be taken in anticipation of an increase or decrease in temperature as a result of a change in the current consumption of device 200 and/or power conditioning element 1100. The controller may also use that information to determine anticipated heat capture and rejection requirements as a result of a change in the current consumption.

Based on a measurement of the current through the voltage regulation circuits, it may be possible to determine the power consumption in the voltage regulators and/or the power dissipation in device 200, thereby enabling controller 1280 to determine the total power dissipation and adjust the heat capture and removal capabilities of micro channel heat exchanger 1210 accordingly. The heat capture and removal capabilities of micro channel heat exchanger 1210 may be modified by altering the rate of flow of the working fluid in micro channels 1220 (for example, by adjusting the output flow rate of pump 1230). Further, controller 1280 may also adjust the heat rejection capabilities after the heat is captured and removed from device 200 and module 1000. Other techniques for changing the heat capture and removal capabilities of micro channel heat exchanger 1210 are described in the Kenny et al. Application, which are hereby incorporated by reference.

In the embodiment of FIG. 16, sensor(s) 1290 are integrated with the voltage regulators in power conditioning element 1100. It should be noted that controller 1280 may also determine the power requirements and/or consumption of device 200 indirectly from the power consumed during operation of device 200. The controller 1280 may then use that information to determine or implement an appropriate course of action, for example, by adjusting the heat capture and removal capabilities of micro channel heat exchanger 1210 or heat rejection capabilities of the system, as discussed above.

Moreover, it should be noted that the functions/operations performed by controller 1280 may be implemented within device 200. Under this circumstance, device 200 determines its power consumption using, for example, information from sensors 1270 (for example, temperature, pressure, flow) and/or current sensor 1290, or information regarding clock rate, electrical activity in subsystems such as floating-point processors, image processing circuits, and analog current output circuits. In response, device 200 may adjust the power delivery capabilities of power conditioning element 1100. The device 200 may also adjust the heat capture, removal and/or rejection capabilities of thermal management element 1200. Employing device 200 to perform some or all of the functions/operations previously performed by controller 1280 facilitates use of information typically available to devices (for example, clock rate), as well as use of computational resources that may already exist in device 200.

In addition, for devices that execute repetitive or predictable functions, it may be possible to predict variations in the power consumption of devices, and to use thermal dynamic models of the entire system to produce an optimal or enhanced strategy for heat capture and rejection management that minimizes temporal or spatial variations in the temperature within device 200. The device 200 and/or controller 1280 may implement sophisticated control algorithms that allow device 200 and/or controller 1280 to determine an appropriate action or response of thermal management element 1200 so that the temperature of device 200 and/or power conditioning element 1100 is maintained within a narrow range. That information may be used to develop a heat capture/rejection operational procedure that achieves an optimal balance between temperature variations of device 200 and operational costs of power and thermal management module 1000. Such operational costs may be power consumption by device 200, computational complexity, and/or operation within preferred flow and thermal ranges.

Moreover, device 200 and/or controller 1280 may use information indicative of the operation of device 200 to predict variations in the spatial distribution of the power dissipation within device 200. For example, if device 200 is a microprocessor, the power consumption of the floating point processor, which takes up a small fraction of the processor's surface, may temporarily exceed the power consumption of the remainder of the microprocessor. In such a case, the temperature of this subsystem of the microprocessor may rise rapidly to temperatures that exceed the recommended operational temperatures. Thus, it may be advantageous for device 200 and/or controller 1280 to predict the concentrated power dissipation in device 200 and, in response, provide the necessary heat capture capabilities dynamically to those concentrated power dissipation regions of device 200.

In another aspect, the present invention is a closed-loop power conditioning and thermal management system. With reference to FIG. 17A, in one embodiment, closed-loop power conditioning and thermal management system 2000 includes power conditioning and thermal management module 1000, as discussed above, in conjunction with the thermal capture and rejection module 1400. In this embodiment, power conditioning and thermal management module 1000 is disposed on printed circuit board 400, device 200 is disposed on power conditioning and thermal management module 1000, and thermal capture and rejection module 1400 is disposed on device 200. In this configuration, power conditioning element 1100 of power conditioning and thermal management module 1000 is disposed in close proximity to device 200 thereby providing the power conditioning advantages described above. Moreover, micro channel heat exchanger 1210 is disposed in close proximity to power conditioning element 1100 thereby facilitating enhanced heat capture, removal and rejection in order to maintain the temperature of power conditioning element 1100 within an acceptable range. The heat captured by thermal management element 1200 is provided (via fluid flow) to heat rejection element 1410 of thermal capture and rejection module 1400.

The thermal capture and rejection module 1400 rejects the heat provided by thermal management element 1200 using heat rejection element 1410, which is illustrated as a heat sink having fins, and thermal capture element 1420. The heat rejection element 1410 may employ many different types of heat rejection techniques, including a design having a fluid flow path or paths throughout the high-surface-area structures (such as fluid channels in the fins) as described and illustrated in the Kenny et al. Application. All of the thermal capture, removal and rejection techniques described and illustrated the Kenny et al. Application are hereby incorporated by reference.

Thermal capture element 1420 includes a micro channel heat exchanger 1430 which facilitates localized heat capture, removal and, in conjunction with heat rejection element 1410, rejection of heat generated primarily by device 200. The micro channel heat exchanger 1430 includes a plurality of micro channels 1440 (which, in operation contain a fluid) for efficient heat capture from device 200. The micro channel heat exchanger 1430, including micro channels 1440, may be fabricated in the same manner and using the same materials as micro heat exchanger 1210 and micro channels 1220.

The micro channel heat exchanger 1430 may be, for example, arranged at the interface of thermal capture element 1420 in accordance with the needs for heat removal from particular regions of device 200. The density of micro channels 1440 may be increased in regions that correspond to anticipated or measured sources of excessive heat In addition, the routing of micro channels 1440 may be designed to reduce and/or minimize temperature gradients from the inlet to the outlet of micro heat exchanger 1420. The widths, depths, and shapes of micro channels 1440 may also be designed and fabricated to improve device temperature uniformity across device 200. Indeed, the shape and layout of micro channels 1440 may be designed through the assistance of thermal modeling tools described in the Kenny et al. Application. Many different types of arrangement, layouts, configurations and design techniques of micro heat exchanger 1420 and micro channels 1440 are described and illustrated in the Kenny et al. Application, which are hereby incorporated, in total, by reference.

Similar to description above relative to thermal management module 1200, the micro channels of micro heat exchanger 1420 may be disposed on both interfaces of thermal capture element 1420 to enhance the thermal capture, removal and/or rejection from the heat generating device(s). Moreover, it should be noted that micro channel heat exchanger 1430 may be configured as an array of micro channel pillars. In this regard, an array of vertical channels are interconnected laterally on an interface (or on both interfaces) of thermal capture element 1420. This configuration may further enhance the thermal capture, removal and/or rejection of heat energy generated by device 200 and/or power conditioning and thermal management module 1000.

With continued reference to FIG. 17A, in this embodiment, pump 1230 is disposed between thermal capture and rejection module 1400 and heat rejection element 1410. The pump 1230 may be an electro-osmotic pumping device as described in detail in the Kenny et al. Application. Many different types of configurations and designs of pump 1230 are acceptable including those described and illustrated in the Kenny et al. Application, which are hereby incorporated by reference.

It should be noted that system 2000 may employ multiple pumps and/or independent fluid cooling loops to allow for independent control of the heat capture capabilities at different locations within module 1000. This feature is also discussed in detail in the Kenny et al. Application, and is also hereby incorporated by reference.

With reference to FIG. 17B, under certain circumstances, it may be advantageous to locate heat rejection element 1410 remotely from the other elements of system 2000. Such a configuration facilitates use of system 2000 in a space-constrained environment yet provides sufficient power conditioning and thermal management in a small footprint. Where heat rejection element 1410 is located remotely, tubing 1260 provides a fluid path for fluid heated by device 200 and power conditioning element 1210 to heat rejection element 1410. In this embodiment, the remotely located heat rejection element 1410 may be placed in an area having sufficient volume for a fin array (and possibly with a fan), without interfering with other system needs for placement of peripheral system elements such as memory or data storage in proximity to device 200 indeed, as mentioned above, under certain circumstances, heat rejection functionality may be unnecessary altogether.

Figure 18:
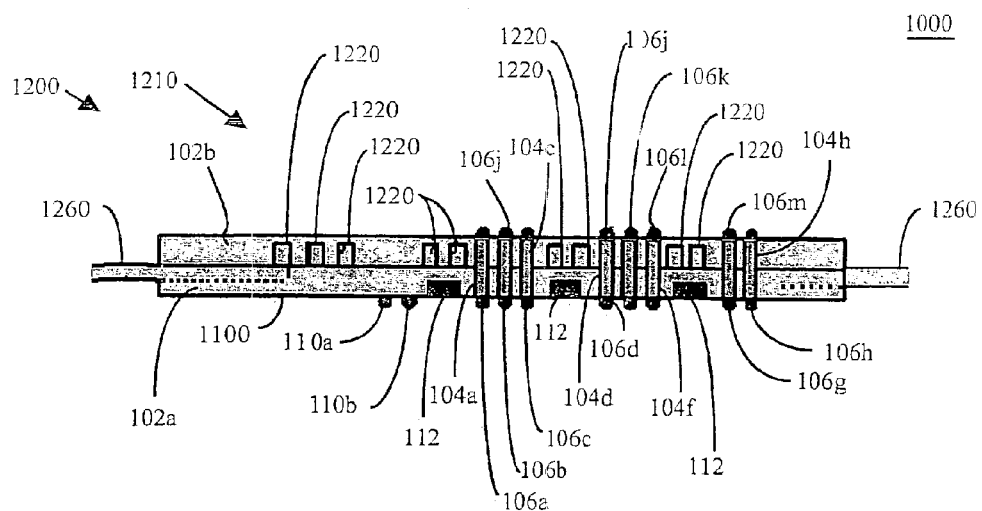
FIG. 18 is a cross-sectional view of a power conditioning and thermal management module in accordance with another aspect of the present invention.

The power conditioning and thermal management module 1000 of FIGS. 8–17B illustrate the power conditioning element disposed on the thermal management element. In the embodiment of FIG. 18, however, thermal management element 1100 is disposed on power conditioning element 1200. In this embodiment, thermal management element 1200 may more efficiently capture and remove heat generated by device 200 because of the proximity of the micro channels to device 200. Moreover, the capture and removal of heat from electrical circuitry 112 of power conditioning element 1100 may remain relatively unchanged. Thus, thermal management element 1200 may more efficiently capture and remove heat generated by both device 200 and power conditioning element 1100. Accordingly, in this embodiment, there may be no need to incorporate a heat rejection element (for example, a heat sink, not shown) because of the heat capture and removal functions performed by thermal management element 1100.

It should be noted that, like in the embodiment illustrated in FIG. 8, micro channels 1220 (illustrated in FIG. 18) may also extend into the interface of power conditioning element 1100. In addition, micro channel structure 1220 may be formed on both the first and second mating interfaces of thermal management module 1100. Under this circumstance, micro heat exchanger 1210 may even more efficiently capture and remove heat from both device 200 and power conditioning element 1200 due, in part, to more intimate physical contact of the heat exchanger 1210 with both device 200 and power conditioning element 1200.

In addition to the thermal consideration, the electrical circuitry of the power conditioning element remains in close proximity with the device thereby providing all of the power conditioning advantages described above.

The power conditioning and thermal management module 1000 of FIG. 18 may be fabricated and implemented in the same manner as the power conditioning and thermal management module 1000 illustrated in FIG. 8. In addition, power conditioning and thermal management module 1000 of FIG. 18 may include all of the features, additions, attributes, and embodiments of power conditioning and thermal management module 1000 of FIGS. 8–17B. In this regard, power conditioning and thermal management module 1000 of FIG. 18 may include, for example, a controller, parameter sensor(s) (for example, temperature, pressure and flow) to measure or detect the operating conditions of device 200 and/or power conditioning element 1200, and current sensor(s) to monitor the current consumed by device 200 and/or power conditioning element 1200. The power conditioning and thermal management module 1000 of FIG. 18 may also include pump(s) to provide working fluid to the micro channels, including for example, electro-osmotic pump(s) having a small footprint to facilitate incorporation of the module in a space-constrained environment. The power conditioning and thermal management module 1000 of FIG. 18 may also include multiple independent micro channels to allow independent thermal capture and removal of designated areas of device 200 and/or power conditioning element 1200.

Moreover, power conditioning and thermal management module 1000 of FIG. 18 may be implemented in the packaging configurations of FIG. 11, 12A and 12B in essentially the same manner as the embodiment of FIG. 8. Indeed, all of the features and attributes of power conditioning and thermal management module 1000 illustrated in FIGS. 8–17B, and described above, are equally applicable to the power conditioning and thermal management module of FIG. 18. For the sake of conciseness, the details of the features and attributes of the embodiments will not be repeated here.

With continued reference to FIG. 18, power conditioning and thermal management module 1000 may route the signals to and from device 200 using all of the same techniques as described above with respect to FIGS. 2–17B. Moreover, power and ground may be routed to and from electrical circuitry 112 and device 200 using those same techniques: For example, the embodiment of FIG. 18 may employ the routing technique describe in the embodiment of FIG. 6 wherein the output power and ground conduits are formed in substrate using conventional fabrication techniques and are routed to predetermined pads which corresponds to power or ground inputs of device 200. Under this circumstance, output power and ground conduits are routed directly to the power and ground inputs of device 200.

Figure 19A:
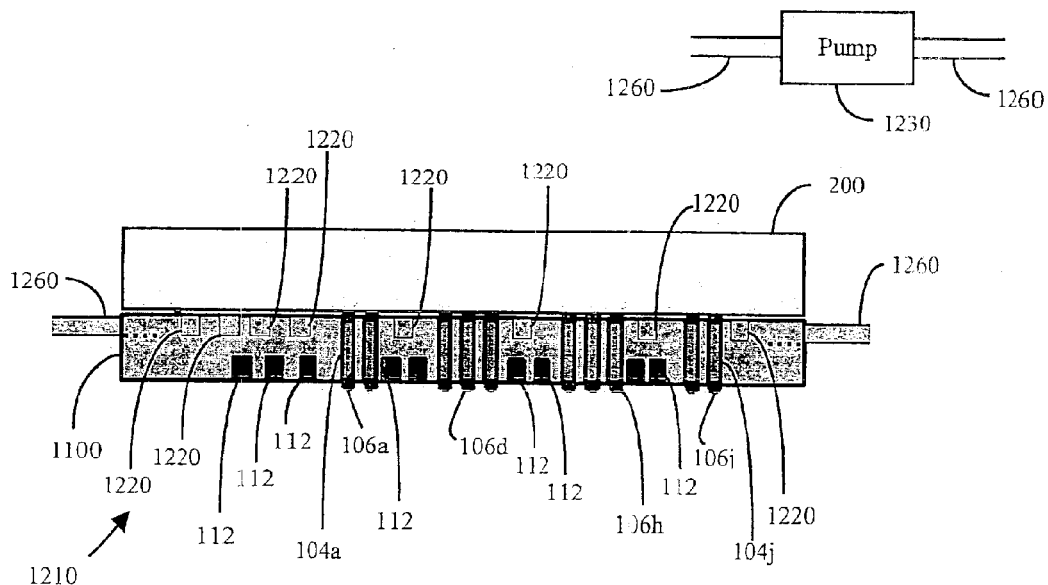
FIGS. 19A, 19B and 19C are block diagram representations of the power conditioning and thermal management modules incorporated in an integrated circuit application.

In yet another embodiment, the power conditioning element and the micro channel structure of the thermal management element are fabricated in the same substrate—rather than two substrates 102a and 102b, as described above and illustrated in FIGS. 8 and 18. With reference to FIG. 19A, micro channel structure 1210 and power conditioning element 1100 are fabricated in the same substrate. In this embodiment, the assembly costs may be reduced because the thermal management element and the power conditioning element need not be assembled from two separate substrates before interfacing with the consuming device and another substrate (for example, a printed circuit board). In addition, the capture and removal of heat from the consuming device may be enhanced, relative to the embodiment of FIG. 9, because of the proximity of the micro channels to the heat generating circuitry disposed on the consuming device. Moreover, the capture and removal of heat from electrical circuitry 112 of power conditioning element 1100 may be sufficient and, as such, this embodiment may not require additional heat removal, capture and rejection capabilities from, for example a heat sink and/or fan.

With continued reference to FIG. 19A; in this embodiment, micro channel structure 1210 of thermal management element 1200 may be fabricated using conventional micro channel fabrication techniques and/or those techniques described and illustrated in the Kenny et al. Application, which are hereby incorporated by reference. Thereafter, electrical circuitry 112 of power conditioning element 1100 may be fabricated using conventional CMOS or BJT design and fabrication techniques. In this embodiment, the interface, power and ground vias may be fabricated before or after the formation of the micro channel structure. The pads (if any) that connect to the vias may be fabricated after fabrication of electrical circuitry 112 and micro channels 1220.

It should be noted that all of the features, attributes, alternatives and embodiments of power conditioning and thermal management module 1000 that include multiple substrates (i.e., 102a and 102b) are fully applicable to the embodiment of FIG. 19A. In this regard, power conditioning and thermal management module 1000 of FIG. 19A may include, for example, a controller, parameter sensor(s) (for example, temperature, pressure and flow), and current sensor(s). The power conditioning and thermal management module 1000 of FIG. 19A may also include pump(s) and multiple independent micro channels to allow independent thermal capture and removal of designated areas of device 200 and/or power conditioning element 1200.

Moreover, power conditioning and thermal management module 1000 of FIG. 18A may be implemented in the packaging configurations of FIG. 11, 12A and 12B. Indeed, all of the features and attributes of the power conditioning and thermal management module 1000 illustrated in FIGS. 8–18, and described above, are equally applicable to the power conditioning and thermal management module of FIG. 19A.

With continued reference to FIG. 19A, power conditioning and thermal management module 1000 may route the signals to and from device 200 using any of the signal routing techniques described above. Power and ground may be routed to and from electrical circuitry 112 and device 200 using those same techniques, including the techniques illustrated in FIG. 6 and described above.

It should be noted that under those circumstances where electrical circuitry 112 of power conditioning element 1100 may be subjected to micro channel processing without damage, electrical circuitry 112 may be fabricated before fabrication of the micro channel structure. As such, the interface, power and ground vias may be fabricated before or after the formation of the micro channel structure. The pads (if any) that connect to the vias may be fabricated after the other elements of power conditioning and thermal management module 1000.

Figure 19B:
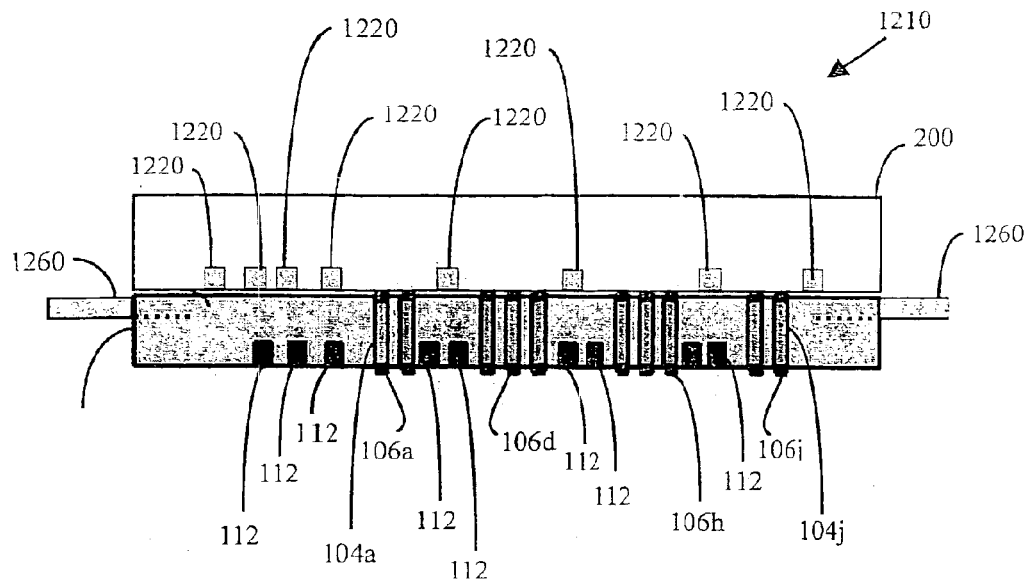
Figure 19C:
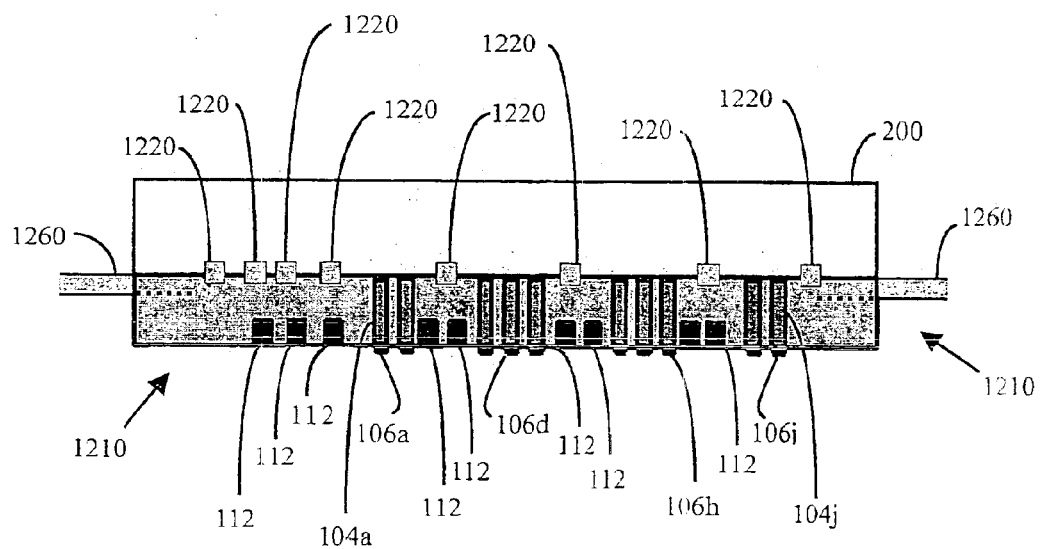

In the embodiment of FIG. 19A, the power conditioning element and micro channel structure of thermal management element 1200 are fabricated in one substrate. In still yet other embodiments, the entire micro channel structure, or a portion of that structure, may be fabricated on the backside of device 200. With reference to FIGS. 19B and 19C, micro channels 1220 of micro channel structure 1210 may be fabricated entirely in device 200 (FIG. 19B) or partially in device 200 and power conditioning element 1100 (FIG. 19C). The discussion above with respect to FIG. 19A is fully and equally applicable to power conditioning and thermal management modules illustrated in FIGS. 19B and 19C. For the sake of brevity, that discussion will not be repeated.

Another aspect of the present invention is the use of the module and/or elements described herein (for example, power conditioning module 100, power conditioning and thermal management module 1000, thermal capture and rejection module 1400, heat rejection element 141.0 and thermal capture element 1420) as building blocks in designing a system having local power conditioning functionality as well as heat capture, removal and/or rejection capabilities. For example, with reference to FIGS. 20, in one embodiment, device 200 is disposed on printed circuit board 400, and thermal capture element 1420 is disposed on device 200 to facilitate capture of localized heat generated by device 200. The power conditioning and thermal management module 1000 is disposed on thermal capture element 1420. In this embodiment, it may be advantageous to locate power conditioning element 1100 between thermal capture element 1420 and thermal management element 1200 to enhance the capture of heat generated by power conditioning element 1100. Further, heat rejection element 1410 (for example, a heat sink having fins) may be disposed on thermal management element 1200 to permit enhanced rejection of the heat captured by thermal management element 1200 generated primarily by power conditioning element 1100) and thermal capture element 1420 (generated primarily by device 200).

Figure 20:
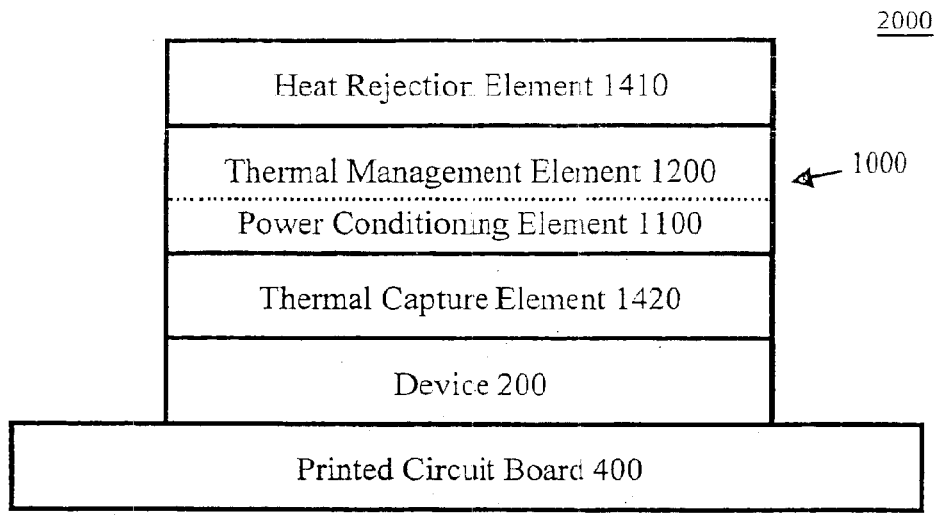
FIG. 20 is a block diagram representation of one embodiment of a closed-loop power conditioning and thermal management system according to the present invention.

In the embodiment illustrated in FIG. 20, power conditioning element 1100 is in close proximity to device 200. Power and ground connections to and from power conditioning element 1100 may be accomplished using a wire bond configuration described herein. (See, for example, FIGS. 4 and 7).

With continued reference to FIG. 20, the pump (not shown) may be an electro-osmotic type pump(s) located in thermal management module 1200 and/or thermal capture element 1420. Moreover, the pump need not be located in thermal management module 1200 or thermal capture element 1420 but rather may be a "stand alone" device. As suggested above, the pump may include a plurality of pumping mechanisms, including mechanisms having configurations as described in the Kenny et al. Application.

Figure 21:
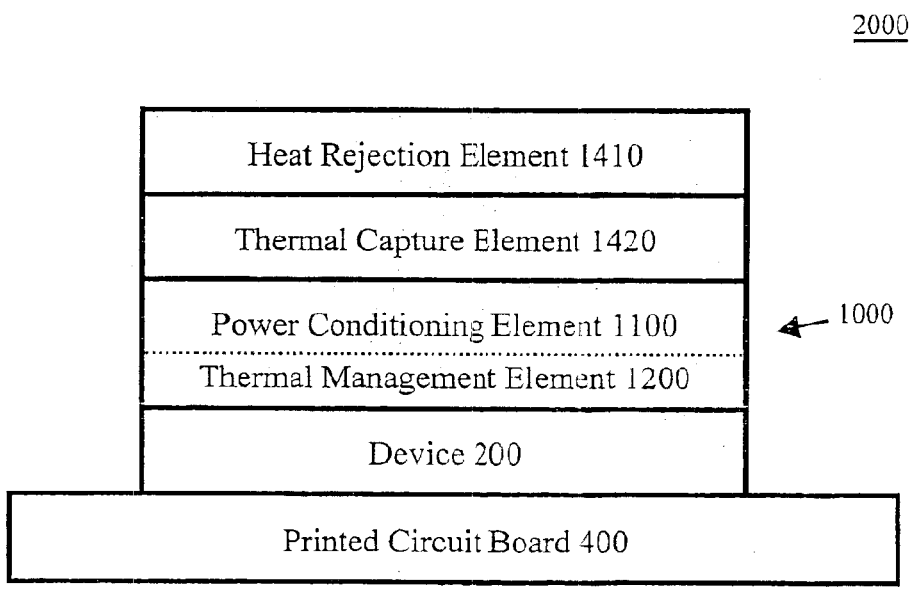
FIG. 21 is a block diagram representation of another embodiment of the closed-loop power conditioning and thermal management system according to the present invention.

Another example of using modules and/or elements as building blocks is illustrated in FIG. 21. With reference to FIG. 21, in this embodiment, power conditioning and thermal management module 1000 is disposed on device 200 and thermal capture element 1420 is disposed on power conditioning element 1100 of power conditioning and thermal management module 1000. Further, heat rejection element 1410 is disposed on thermal capture element 1420 to enhance the rejection of the heat captured by thermal management element 1200 (generated primarily by device 200) and thermal capture element 1420 (generated primarily by power conditioning element 1100).

Figure 22:
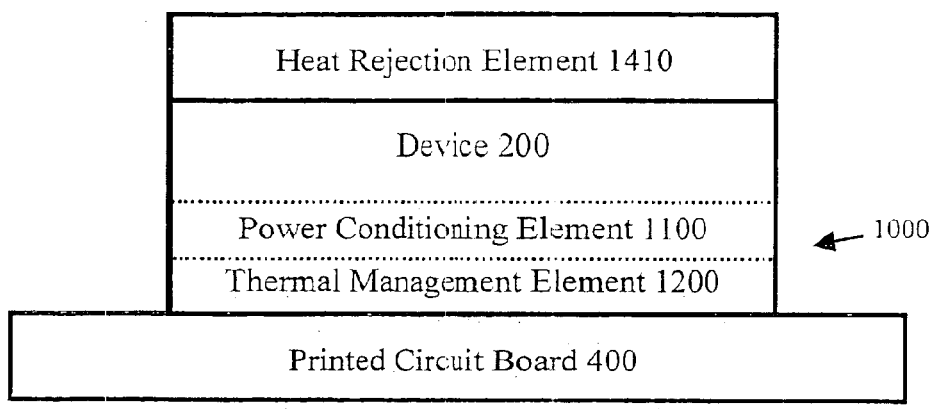
FIG. 22 is a block diagram representation of another embodiment of the closed-loop power conditioning and thermal management system according to the present invention.

In addition, the power conditioning and thermal management functions may be incorporated (in whole or in part) into other modules or elements, or even the consuming device itself. In this regard, these function(s) may be combined in consuming device to facilitate a more compact and cost effective system. With reference to FIG. 22, in this embodiment of the invention, power conditioning and thermal management module 1000 is disposed in device 200 and thermal capture element 1420 may be disposed on device 200 to enhance the rejection of the heat captured by thermal management element 1200 (generated by device 200 and power conditioning element 1100). In addition, due to the close proximity of thermal rejection element 1410 to device 200, thermal rejection element 1410 directly captures and rejects heat generated by device 200. However, under those circumstances where additional thermal capture and rejection capacity provided by thermal rejection element 1410 is not necessary, thermal rejection element 1410 may be omitted.

It should be noted that power conditioning and thermal management module 1000 may be disposed on the back side of device 200 or power conditioning element 1100 and/or thermal management element 1200 may be disposed on the both the front and back sides of device 200. Moreover, power conditioning element 1100 may be disposed on the front side of device 200 and thermal management element 1200 may be disposed on the backside.

Figure 23:
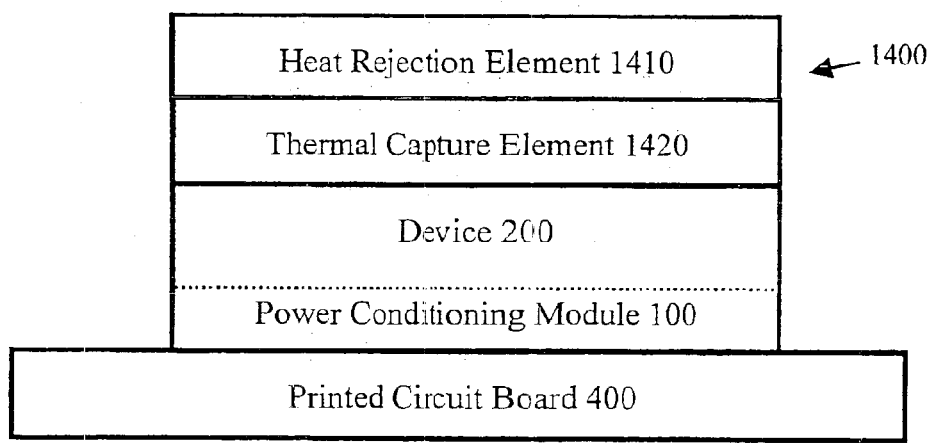
FIG. 23 is a block diagram representation of another embodiment of the power conditioning system according to the present invention.

With reference to FIG. 23, in another embodiment of the invention, system 2000 includes power conditioning module 100 that is disposed in device 200 and thermal capture and rejection module 1400 may be disposed on device 200 to provide thermal management of device 200 and power conditioning element 1100. As with the embodiment illustrated in FIG. 22, power conditioning module 100 of FIG. 23 may be disposed on the backside of device 200 or on the front side of device 200. Moreover, power conditioning module 100 may be disposed on the both the front and back sides of device 200.

It should be noted that in all of the embodiments illustrated in FIGS. 20–23, the elements and modules, as well as the consuming device that includes the power conditioning and/or thermal management functions/elements, may include the features, attributes, alternatives and advantages of the corresponding elements and modules illustrated in FIGS. 2–19, and described above. For the sake of brevity, those features, attributes, and advantages will not be restated here.

In addition, under those circumstances where thermal capture and rejection capacity provided by thermal rejection element 1410 is not necessary, thermal rejection element 1410 may be omitted altogether.

Figure 24:
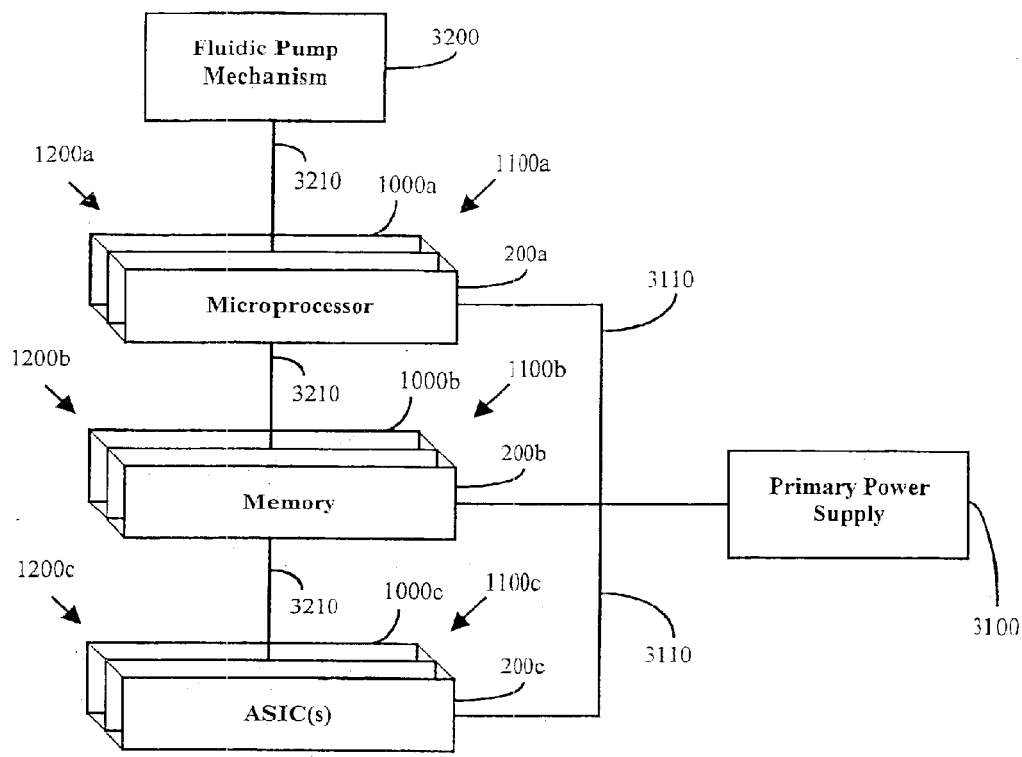
FIG. 24 is a block diagram representation of a closed loop power conditioning and thermal management system, including power and thermal buses according to another aspect of the invention.

Another aspect of the present invention is a system including a plurality of consuming devices, each having a power conditioning and thermal management module that receives power from a primary power supply and a working fluid from a fluidic pumping mechanism. With reference to FIG. 24, in this embodiment, primary power supply 3100 provides initial power conditioning of an external power source (not shown). The output of primary power supply 3100 is provided to each of the power conditioning elements 1100a–c of power conditioning and thermal management module 1000a–c, respectively. The power conditioning elements 1100a–c provide localized power conditioning for the consuming device 200a–c, respectively. The power conditioning elements 1100a–c may be any one of the embodiments described above and illustrated in FIGS. 8–19.

The primary power supply 3100 provides the initially conditioned power to each power conditioning elements 1100a–c by way of power bus 3110; The power bus 3110 may be routed in parallel to each of power conditioning elements 1200a–c.

The primary power supply 3100 may include discrete components, similar to that illustrated in FIG. 1, or may be a power conditioning module 1100, similar to that described above with respect to FIG. 2. Moreover, primary power supply 3100 may also include additional power supply circuitry positioned more locally to the devices 200a–c. The additional power supply circuitry may provide additional initial conditioning of the power before being supplied to power conditioning elements 1100a–c.

With continued reference to FIG. 24, fluidic pumping mechanism 3200 provides a working fluid to each of the thermal management elements 1100a–c of power conditioning and thermal management module 1000a–c, respectively. The thermal management elements 1100a–c captures and removes heat generated by devices 200a–c and/or power conditioning elements 1100a–c. The thermal management elements 1100a–c may be any one of the embodiments described above and illustrated in FIGS. 8–19. Moreover, system 3000 of FIG. 24 may also include local heat rejection elements (not shown) that are disposed on or near devices 200a–c. System 3000 may also, or alternatively include a global heat rejection element (not shown) that rejects heat for one or more of the thermal management elements 1100a–c. The heat rejection element(s) may include the features of the heat rejection element and thermal rejection module as illustrated in FIGS. 2–19 and described above.

The fluidic pump mechanism exchanges the working fluid with each thermal management element 1200a–c by way of fluid bus 3210. That is, pumping mechanism 3200 provides cool fluid to each thermal management element 1200a–c using fluid bus 3210; and fluid bus 3210 provides a path for the heated fluid from thermal management element 1200a–c to fluidic pump mechanism 3200. The fluid bus 3210 may be routed in parallel or series to each of thermal management elements 1200a–c.

It should be noted that system 3000 of FIG. 24 may be implemented using power conditioning module 100 illustrated in FIGS. 2–7, and described above. Under this circumstance, the thermal management operations or functions may be performed in any manner, including those described above and illustrated in FIGS. 2–7, 20 and 21. Thus, depending on the type of thermal management technique employed, a fluidic pump mechanism 3200 and fluid bus 3210 may be unnecessary.

Various embodiments of the present invention have been described herein. It is understood, however, that changes, modifications and permutations can be made without departing from the true scope and spirit of the present invention as defined by the following claims, which are to be interpreted in view of the foregoing. For example, other permutations of the module(s) and element(s) combinations are possible to provide a system having a power conditioning feature and a thermal management feature. In this regard, other combinations of the modules and elements in a building block approach, as illustrated in FIGS. 20–23, are suitable and are contemplated, and, as such, fall within the scope of the present invention.

In addition, the power conditioning and thermal management features may be combined in other modules, elements, or devices of the system, including the consuming device as illustrated in FIGS. 22 and 23, and described above. Incorporating features in this manner is clearly contemplated and, thus falls within the scope of the present invention. Moreover, many different types of arrangement, layouts, configurations, designs, and techniques of micro heat exchangers, micro channels, sensors; and pump mechanisms: are described and illustrated in the Kenny et al. Application, which are all hereby incorporated by reference. Indeed, the Kenny et al. Application is incorporated by reference herein in total.

What is claimed is:

1. A module for providing an electrical connection between an integrated circuit device and a circuit board, the module comprising:
   a. a receiving area within the module, the receiving area configureable for receiving the integrated circuit device;
   b. a power conditioning element positioned within the receiving area, the power conditioning element further comprising:
      i. a substrate; and
      ii. electrical circuitry for conditioning power applied to the integrated circuit device, the electrical circuitry disposed in the substrate; and
   c. a thermal management element for capturing thermal energy, the thermal management element having a plurality of fluid channeling features configured within, the thermal management element coupled to the power conditioning element.

2. The module according to claim 1 wherein the power conditioning element further comprises a plurality of interface vias for providing electrical connection between the module and the integrated circuit device, wherein the interface vias are positioned within the substrate.

3. The module according to claim 1 wherein the module further comprises a plurality of external connectors for providing electrical connection between the module and the integrated circuit device.

4. The module according to claim 1 further comprising a lid for hermetically sealing the module, wherein the lid is coupled to the module.

5. The module according to claim 1 further comprising at least one fluid port for providing a fluid to the thermal management element.

6. The module according to claim 5 wherein the at least one fluid port is coupled to the module, the module thereby circulating the fluid to and from the thermal management element through the module.

7. The module according to claim 5 wherein the at least one fluid channel is coupled to the module via the circuit board, wherein the fluid is circulated to and from the thermal management element through the module.

8. The module according to claim 5 further comprising a pump for providing fluid to the thermal management element, wherein the pump is coupled to the at least one fluid port.

9. The module according to claim 1 further comprising a plurality of circuit board pins for electrically connecting the module to the circuit board.

* * * * *